US012044726B2

(12) United States Patent
Reid et al.

(10) Patent No.: US 12,044,726 B2
(45) Date of Patent: Jul. 23, 2024

(54) CALIBRATION SYSTEM

(71) Applicant: Xcerra Corporation, Norwood, MA (US)

(72) Inventors: William Reid, Cedar Park, TX (US); Aaren Lonks, St. Paul, MN (US)

(73) Assignee: XCERRA CORPORATION, Norwood, MA (US)

( * ) Notice: Subject to any disclaimer, the term of this patent is extended or adjusted under 35 U.S.C. 154(b) by 0 days.

(21) Appl. No.: 17/246,096

(22) Filed: Apr. 30, 2021

(65) Prior Publication Data

US 2022/0349937 A1 Nov. 3, 2022

(51) Int. Cl.
*G01R 31/28* (2006.01)
*G01R 1/073* (2006.01)

(52) U.S. Cl.
CPC ..... *G01R 31/2889* (2013.01); *G01R 1/07364* (2013.01)

(58) Field of Classification Search
CPC ............ G01R 31/2889; G01R 1/07364; G01R 1/07328; G01R 1/07378
See application file for complete search history.

(56) References Cited

U.S. PATENT DOCUMENTS

| | | | | |
|---|---|---|---|---|
| 5,712,569 A * | 1/1998 | Canu | ...................... | G01R 31/66 439/489 |
| 6,242,930 B1 * | 6/2001 | Matsunaga | ........ | G01R 1/06772 324/755.02 |
| 6,281,691 B1 * | 8/2001 | Matsunaga | ........ | G01R 1/06738 324/755.05 |
| 6,366,244 B1 * | 4/2002 | Fernandes | .............. | H04B 7/216 343/873 |
| 6,411,079 B1 * | 6/2002 | Nishikawa | ......... | G01R 31/2887 324/750.19 |
| 6,441,632 B1 * | 8/2002 | Correia | ................ | G01R 1/0483 324/750.25 |
| 6,480,004 B1 * | 11/2002 | Iwasaki | .................. | G01R 31/69 324/754.03 |
| 6,937,037 B2 * | 8/2005 | Eldridge | ............ | G01R 1/07307 257/E23.024 |
| 6,970,006 B2 * | 11/2005 | Appen | ............... | G01R 31/2834 324/750.02 |
| 8,446,165 B2 * | 5/2013 | McCoy | .............. | G01R 31/2801 324/763.01 |
| 8,933,707 B1 * | 1/2015 | Tsironis | ............. | G01R 31/2831 324/207.13 |
| 11,480,589 B1 * | 10/2022 | Tsironis | ............. | G01R 31/2891 |
| 2003/0132759 A1 * | 7/2003 | Tsironis | ............. | G01R 1/06772 324/601 |

(Continued)

OTHER PUBLICATIONS

U.S. Appl. No. 16/593,200, Final Office Rejection Dec. 2021 (Year: 2021).*

(Continued)

*Primary Examiner* — Paresh Patel
(74) *Attorney, Agent, or Firm* — Knobbe Martens Olson & Bear LLP

(57) ABSTRACT

A verification probe system is configured to verify an automated test platform and includes: an integrated circuit test probe assembly; and a moveable platform configured to position the integrated circuit test probe assembly proximate one of more conductive pins included within a test socket assembly of the automated test platform.

27 Claims, 17 Drawing Sheets

(56) References Cited

U.S. PATENT DOCUMENTS

2010/0001742 A1* 1/2010 Strid .................... G01R 35/005
324/601
2020/0116759 A1* 4/2020 Mroczkowski .... G01R 1/06766

OTHER PUBLICATIONS

U.S. Appl. No. 16/593,200, Non-Final Rejection May 2021 (Year: 2021).*
DE 202008010533 U1 English translation (Year: 2020).*

* cited by examiner

CALIBRATION SYSTEM

TECHNICAL FIELD

This disclosure relates to calibration equipment and, more particularly, to calibration equipment that calibrates automated test equipment systems at the contactor pin of the DUT test socket.

BACKGROUND

Automated test equipment systems may be used to test various electronic components, which are often referred to as a Device Under Test (DUT). Such systems may automate the testing of such components, wherein a component may be subjected to a battery of different tests in some form or logical fashion. Additionally, such systems may provide further levels of automation, wherein the components being tested may be automatically swapped out (upon completion of a testing procedure) and replaced with a component that is yet to be tested.

Most automated test equipment system vendors warrantee performance at a blind-mate interface located at the bottom of a customer's adapter board. One of the reasons for warranting only at this plane is that there really wasn't an easy and direct method of measuring performance at a Device Under Test (DUT) test socket. RF probes, in general, are very fragile and there hasn't been a probe robust enough to be utilized for automated test equipment specification verification when compression of the contactor pins is required.

SUMMARY OF DISCLOSURE

In one implementation, a verification probe system is configured to verify an automated test platform and includes: an integrated circuit test probe assembly; and a moveable platform configured to position the integrated circuit test probe assembly proximate one of more conductive pins included within a test socket assembly of the automated test platform.

One or more of the following features may be included. The moveable platform may include: a first-axis displacement system configured to allow for displacement of the integrated circuit test probe assembly in a first axis. The moveable platform may include: a second-axis displacement system configured to allow for displacement of integrated circuit test probe assembly in a second axis. The moveable platform may include: a third-axis displacement system configured to allow for displacement of integrated circuit test probe assembly in a third axis. A bracket assembly may affix the integrated circuit test probe assembly to the moveable platform. The integrated circuit test probe assembly may include: a mounting fixture; at least one co-planar waveguide lead frame having a device contact point, the co-planar waveguide lead frame mounted to the mounting fixture; and at least one radio frequency (RF) connector assembly electrically coupled with the co-planar waveguide lead frame. At least one co-planar waveguide lead frame may have a metal layer and a substrate layer. The metal layer may have a signal lead surrounded on two sides by a ground. A gap and signal width may be defined to match impedance of test equipment. The gap and the signal width may be defined to match impedance of a device under test (DUT). At least one co-planar waveguide lead frame may be a single ground-signal-ground co-planar waveguide lead frame. At least one co-planar waveguide lead frame may be at least one of: a single ground-signal-signal-ground co-planar waveguide lead frame, a single ground-signal-ground-signal-ground co-planar waveguide lead frame, or a single ground-signal-ground-signal-ground-signal-ground co-planar waveguide lead frame. The co-planar waveguide lead frame may be a single ended to differential balun. One co-planar waveguide lead frame may include multiple co-planar waveguide lead frames. The co-planar waveguide lead frame may have a mounting structure. The mounting structure may include one or more of screw holes and dowel pin slots. The RF connector assembly may be defined by a longitudinal axis, the longitudinal axis disposed at about a 45-degree angle relative to a plane defining in part the co-planar waveguide lead frame. The RF connector assembly may have a center conductor assembly compression mounted to the co-planar waveguide lead frame. The RF connector assembly may have a center conductor assembly having at least one center conductor, the center conductor including one or more spacers.

In one implementation, a verification probe system is configured to verify an automated test platform and includes: an integrated circuit test probe assembly; and a moveable platform configured to position the integrated circuit test probe assembly proximate one of more conductive pins included within a test socket assembly of the automated test platform, wherein the moveable platform includes: a first-axis displacement system configured to allow for displacement of the integrated circuit test probe assembly in a first axis, a second-axis displacement system configured to allow for displacement of integrated circuit test probe assembly in a second axis, and a third-axis displacement system configured to allow for displacement of integrated circuit test probe assembly in a third axis.

One or more of the following features may be included. The integrated circuit test probe assembly may include: a mounting fixture; a co-planar waveguide lead frame having a device contact point, the co-planar waveguide lead frame mounted to the mounting fixture; and at least one radio frequency (RF) connector assembly electrically coupled with the co-planar waveguide lead frame, the RF connector assembly includes a connector body and a center conductor assembly, the center conductor assembly including a center conductor extending from a first end to a second end and is defined in part by a conductor longitudinal axis. The center conductor may include a tapered end at the first end. The at least one RF connector assembly may be defined by a longitudinal axis, the longitudinal axis disposed at about a 45 degree angle relative to a plane defining in part the co-planar waveguide lead frame. A gap and signal width may be defined to match impedance of test equipment. A gap and the signal width may be defined to match impedance of a DUT.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Automated Test Platform

Figure 1A:
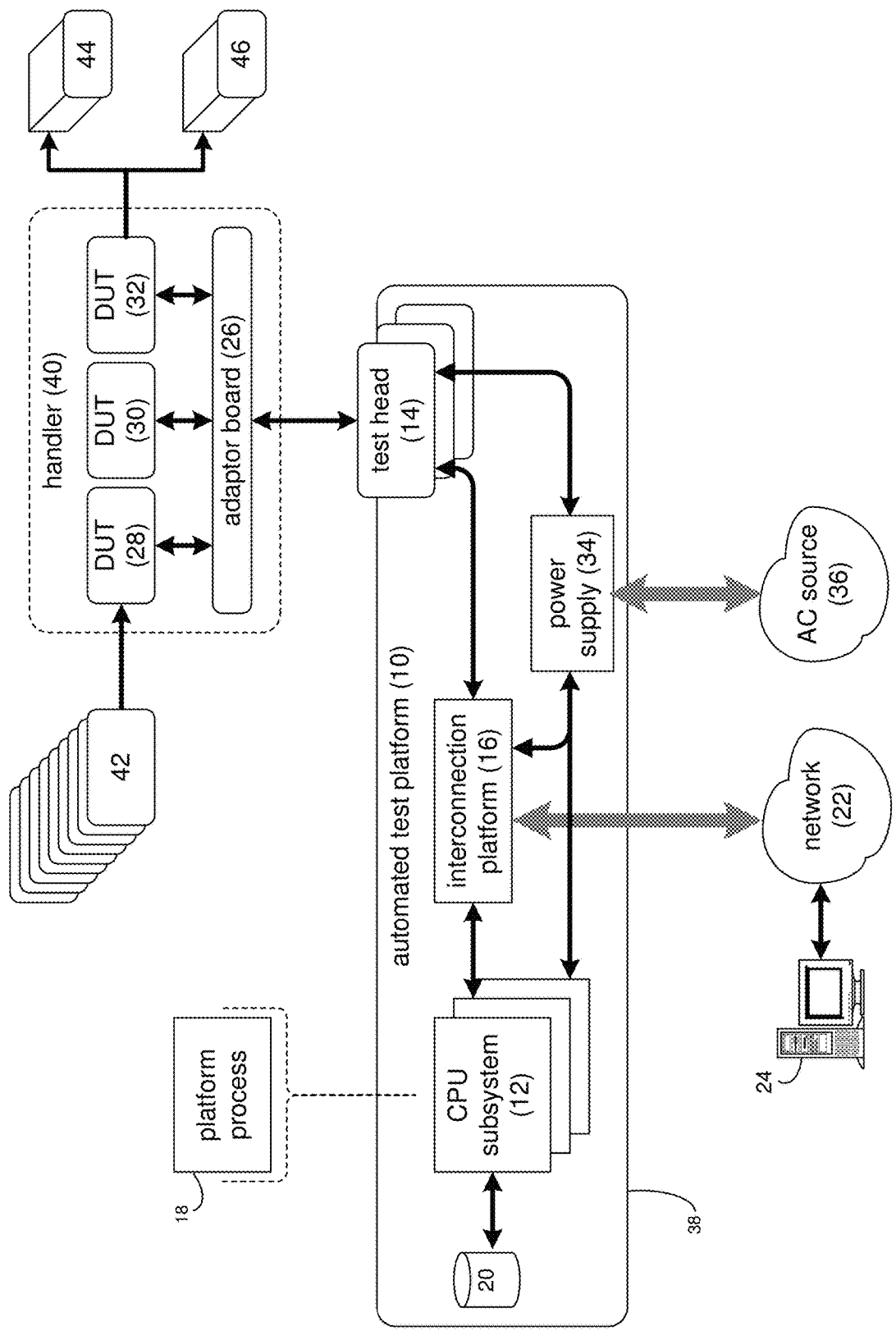
FIG. 1A is a diagrammatic view of an automated test platform.

Referring to FIG. 1A, there is shown automated test platform 10. Examples of automated test platform 10 may include, but are not limited to, systems that automate the verification and validation of devices under test (DUTs). Automated test equipment systems (e.g. automated test platform 10) may be used to test various electronic components in an automated fashion. Typically, the devices under test are subjected to a battery of different tests, wherein the testing procedures are automated in a logical fashion. For example, during the testing of a power supply, the power supply may be subjected to varying voltage levels and varying voltage frequencies. Further, during the testing of a noise canceling circuit, such a circuit may be subjected to varying levels and frequencies of noise to confirm the satisfactory performance of the same.

Automated test platform 10 may include one or more central processing units (e.g. CPU subsystem 12) and one or more test heads (e.g. test head 14), which may be coupled together via interconnection platform 16 (e.g., a PCIe bus or a USB bus). As will be discussed below in greater detail, an example of test head 14 may be a blind mate connector. As is known in the art, a blind mate connector is a connector that provides or receives power or signal to another device/systems. Blind mate connectors may be distinguished from other connectors in that they do not feature a rigid mechanical retention mechanism belonging to the interface itself, such as a threaded coupling nut on an SMA connector. Blind mate connectors are typically used in a multi-pin arrangement between racks and panels, daughtercard to backplane, or similar applications where the connector is not mated by itself, but rather by the action of inserting the entire unit or module.

Examples of CPU subsystem 12 may include but are not limited to a personal computer, a server computer, a series of server computers, a mini computer or a single-board computer. CPU subsystem 12 may execute one or more operating systems, examples of which may include but are not limited to: Microsoft Windows Server™; Redhat Linux™, Unix, or a custom operating system, for example.

While in this particular example, automated test platform 10 is shown to include three CPU subsystems, this is for illustrative purposes only and is not intended to be a limitation of this disclosure, as other configurations are possible. For example, the number of CPU subsystems utilized within automated test platform 10 may be increased or decreased depending upon the anticipated loading of automated test platform 10.

CPU subsystem 12 may execute one or more automated test programs (via e.g. platform process 18), wherein platform process 18 may be configured to automate the testing of various devices under test. Through the use of platform process 18, an administrator (not shown) of automated test platform 10 may define and execute testing procedures/routines for the various devices under test.

For example, platform process 18 (and test head 14) may be configured to e.g., apply certain test signals to a device under test while monitoring certain output voltages or digital signals being produced by the device under test during the application of those test signals. Accordingly, if the device under test is a power supply circuit, platform process 18 (and test head 14) may apply a line voltage to the power supply circuit while measuring an output voltage being generated by the power supply circuit. Alternatively, if the device under test is an analog to digital controller that is configured to produce various digital output signals in response to various analog input signals, platform process 18 (and test head 14) may be configured to apply various permutations of those analog input signals to the analog to digital controller while measuring the various digital output signals produced by the same.

The instruction sets and subroutines of platform process 18, which may be stored on storage device 20 coupled to/included within CPU subsystem 12, may be executed by one or more processors (not shown) and one or more memory architectures (not shown) included within CPU subsystem 12. Storage device 20 may include but is not limited to: a hard disk drive; an optical drive; a RAID device; a random access memory (RAM); a read-only memory (ROM); and all forms of flash memory storage devices.

CPU subsystem 12 may be connected to one or more networks (e.g., network 22), examples of which may include but are not limited to: a local area network, a wide area network, an intranet or the internet, for example. Accordingly, CPU subsystem 12 may be administered and/or controlled via network 22. Therefore, an administrator (not shown) may use a remote computer (e.g., remote computer 24) coupled to network 22 to define and/or administer various testing procedures and/or routines via platform process 18.

Automated test platform 10 may be configured to work with adapter board 26. wherein adapter board 26 may be configured to adapt test head 14 (which may be universal) to the particular type of device under test. For example, test head 14 may be a universal connector assembly (e.g., a blind mate connector) that is configured to provide signals to and/or read signals from the device under test. Specifically, automated test platform 10 and/or platform process 18 may be configured to e.g., provide one or more signals to the device under test and read the signals present at various test points of the device under test during these procedures.

In this particular example, adapter board 26 is shown being configured to accommodate a plurality of devices under test, namely devices under test 28, 30, 32. However, this is for illustrative purposes only and is not intended to be a limitation of this disclosure, as other configurations are considered to be within the scope of this disclosure. For example, the number of devices under test may be increased or decreased depending upon the design criteria of adapter board 26, test head 14, automated test platform 10 and/or platform process 18.

Automated test platform 10 may include power supply 34 that may be configured to receive AC power from AC source 36 and provide electrical power to e.g., test head 14, interconnection platform 16 and computing device 12. Examples of AC source 36 may include but is not limited to a 120 VAC source, a 240 VAC source, a 120/208 VAC 3-phase source, and a 277/408 VAC 3-phase source. In order to allow automated test platform 10 to have a smaller footprint and utilize less floor space, all components of automated test platform 10 may be housed/contained within a single enclosure (e.g., enclosure 38).

A handler system (e.g., handler system 40) may be configured to automate the testing of the devices under test (e.g., devices under test 28, 30, 32). For the following discussion, handler system 40 is considered to be a system that may perform various operations/procedures with respect to automated test platform 10, examples of which may include but are not limited to: a) the delivery of packaged parts to automated test platform 10 for testing and/or the delivery of unpackaged parts (i.e. a wafer) to automated test platform 10 for testing.

Specifically and for illustrative purposes, handler system 40 may be configured to maintain supply 42 of devices under test, wherein handler system 40 may be automated to e.g., insert devices under test 28, 30, 32 into adapter board 26, notify platform process 18 that devices under test 28, 30, 32 are ready for testing so that platform process 18 may implement the above-described testing procedures. Once these testing procedures are completed, platform process 18 may know which (if any) of devices under test 28, 30, 32 failed the above-described testing procedures. Accordingly, platform process 18 may inform handler system 40 which of devices under test 28, 30, 32 passed the above-described testing procedures and which of devices under test 28, 30, 32 failed the above-described testing procedures, wherein the "passing" devices under test may be removed from adapter board 26 and placed into "passing" bin 44 and the "failing" devices under test may be removed from adapter board 26 and placed into "failing" bin 46. At this point, handler system 40 may repopulate adapter board 26 with additional devices under test (from supply 42) so that platform process 18 may initiate another round of testing.

Test Socket Assembly

Figure 1B:
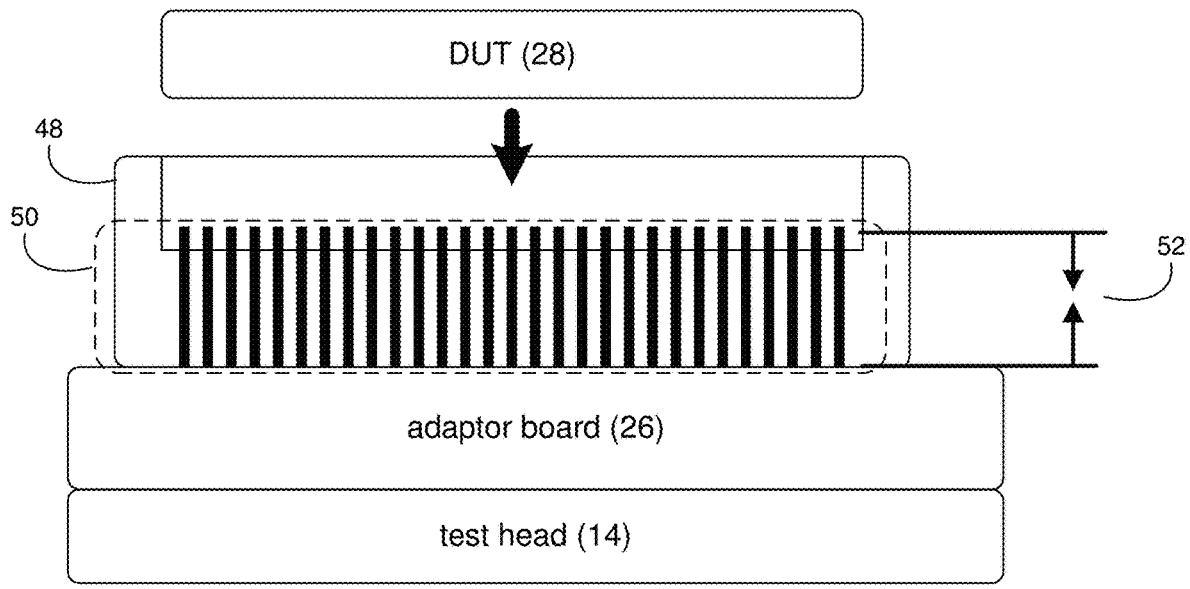
FIG. 1B is a diagrammatic view of a test socket assembly and a test head of the automated test platform of FIG. 1A.
Figure 1C:
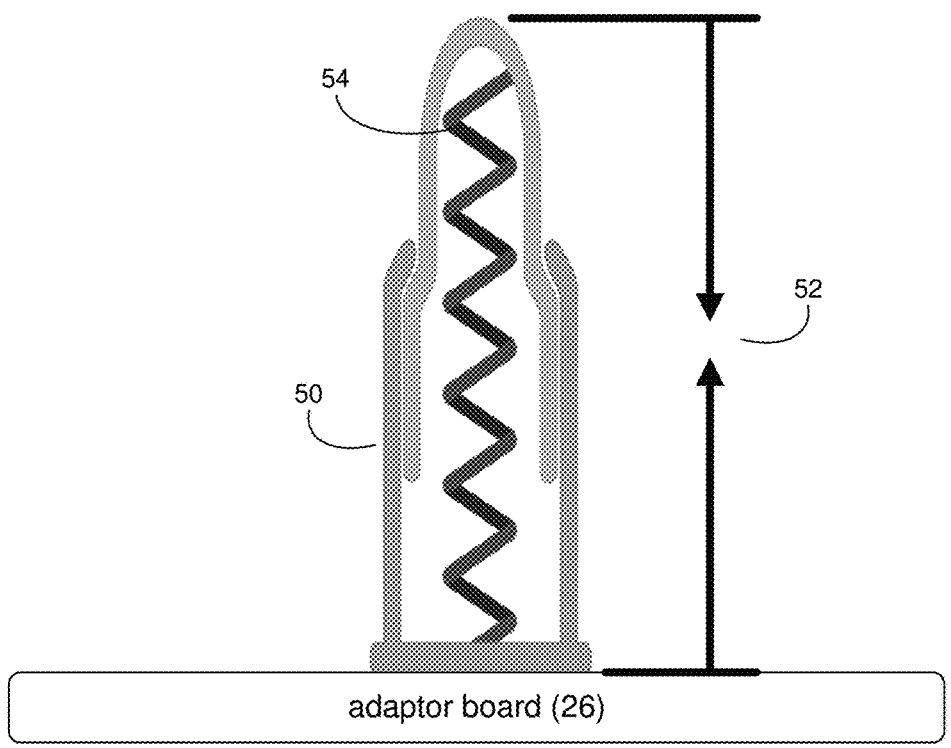
FIG. 1C is a cross-sectional view of a connector assembly of the test socket assembly of FIG. 1B.

Referring also to FIGS. 1B-1C and as discussed above, automated test platform 10 may include one or more test heads (e.g. test head 14), an example of which may include but is not limited to a blind mate connector. As also discussed above, adapter board 26 that may be configured to adapt test head 14 (which may be universal) to the particular type of Device under Test (e.g., DUT 28). For example, adapter board 26 may include test socket assembly 48 configured to releasable receive the Device under Test (e.g., DUT 28). Test socket assembly 48 may include a plurality of conductive pins (e.g., conductive pins 50) configured to releasably electrically couple the Device under Test (e.g., DUT 28) to adapter board 26. The conductive pins (e.g., conductive pins 50) may be configured to be compressible (in the direction of arrows 52) so that when the Device under Test (e.g., DUT 28) is inserted into test socket assembly 48, the conductive pins (e.g., conductive pins 50) are compressed (in the direction of arrows 52) so that they are the length required to electrically couple the Device under Test (e.g., DUT 28) to adapter board 26.

An example of the plurality of conductive pins (e.g., conductive pins 50) may include pogo-pins. As is known in the art, a pogo-pin (or spring-loaded pin) is a type of electrical connector mechanism that is used in many modern electronic applications and in the electronics testing industry. They may be used for their improved durability over other electrical contacts, and the resilience of their electrical connection to mechanical shock and vibration. The name pogo-pin comes from the pin's resemblance to a pogo stick—the integrated helical spring (e.g., spring 54) in the pin (e.g., conductive pins 50) applies a constant normal force against the back of the mating receptacle or contact plate, counteracting any unwanted movement that may otherwise cause an intermittent connection. This helical spring (e.g., spring 54) may make pogo-pins unique, since most other types of pin mechanisms use a cantilever spring or expansion sleeve. A complete connection path requires a mating receptacle for the conductive pin (e.g., conductive pins 50) to engage, which is termed a target or land. A pogo target consists of a flat or concave metal surface (e.g., on the underside of the Device under Test (e.g., DUT 28)), which unlike the conductive pins (e.g., conductive pins 50), has no moving parts. Targets may be separate components in the complete connector assembly, or in the case of printed circuit boards, simply a plated area of the board.

Difficulty with Verification at Test Socket

As discussed above, the performance of automated test equipment systems (e.g., automated test platform 10) is typically defined/guaranteed from the test head (e.g., test head 14), which may be the case for various reasons. For example, adapter board 26 tends to be bespoke for the DUTs being tested. Accordingly, there may be considerable performance variations between adapter boards.

Further, a typical pogo-pin may have compliance (i.e., compressibility) of up to 0.6 mm (or 24 mils). Therefore and when the Device under Test (e.g., DUT 28) is inserted into test socket assembly 48, the conductive path of the conductive pins (e.g., conductive pins 50) will be shortened, which will alter various signal characteristics (e.g., phase, impedance, reflection).

Specifically, the compression of conductive pins 50 may result in a phase change of the electrical signals, due to a path length change. At 50 GHz, with a Teflon dielectric for example, one wavelength (or 360 degrees) is equal to 162 mils or 2.22 degrees per mil of phase change. If a conductive pin has 24 mils of compliance, this compression will result in a 53.3 degrees of phase change caused by the electrical path length change. To calibrate or measure a device with any accuracy, the compression of the contactors must be to the same value for each insertion/measurement. Also, the pogo-pin design has been optimized to perform the best (best impedance match and lowest insertion loss) at the specified compliance level. Therefore, it is critical that the pogo-pins are compressed to their designed target compression value.

One parameter that is critical for measurement accuracy is the measurement of impedance phase. In a typical adapter board, the return loss at 50 GHz, measured looking back into the test socket/adapter board assembly, could be −9 dB. A typical PA (i.e., Power Amplifier) could have 7 dB return loss. The adapter board and PA combination could result in as much as +/−1.5 dB mismatch error. The required goal/specification desired for insertion loss measurements is <+/−1 dB. In order to meet this requirement, it is imperative that the mismatch error be measured and corrected. This correction is known as vector measurement correction. If a 54-degree error occurred, caused by the incorrect compression of the pogo-pins, this could result in an error to the mismatch error correction of as much as +/−0.6 dB. There are many other errors that must be considered, it is obvious from these calculations the importance of the correct compression of the pogo-pins.

The example given above regarding compression concerns the compression of a single contactor pogo-pin. In actuality, each measurement must be made by compressing at least 3 conductive pins; the RF center contactor and one ground pin on either side of the RF contactor pin. All three of these pogo-pin contacts must be compressed equally without distorting the measurement probe. Any error in compression amount or having unequal loading on the probe, will result in a measurement error.

In the event that the performance of automated test equipment systems (e.g., automated test platform 10) was defined/guaranteed at the test socket (e.g., test socket 48), the calibration/certification measurements at these conductive pins (e.g., conductive pins 50) would need to be taken at the conductive pins (e.g., conductive pins 50). Unfortunately and when utilizing traditional RF probes to take measurements at these conductive pins (e.g., conductive pins 50), the conductive pins may be compressed to varying amounts and/or at amounts different than these conductive pins would be compressed if the Device under Test (e.g., DUT 28) was inserted into test socket assembly 48, thus altering the above-described signal characteristics (e.g., phase, impedance, reflection).

Accordingly and for the reasons discussed above, the basis for defining/guarantying the performance of automated test equipment systems (e.g., automated test platform 10) at the test head (e.g., test head 14) is because there really has been no easy and direct method of measuring performance at test socket assembly 48. Further, RF probes (in general) tend to be very fragile and often fail, especially when required to compress the conductive pins (e.g., conductive pins 50) of test socket assembly 48 during the specification and verification of automated test platform 10.

Verification Probe System

Figure 1D:
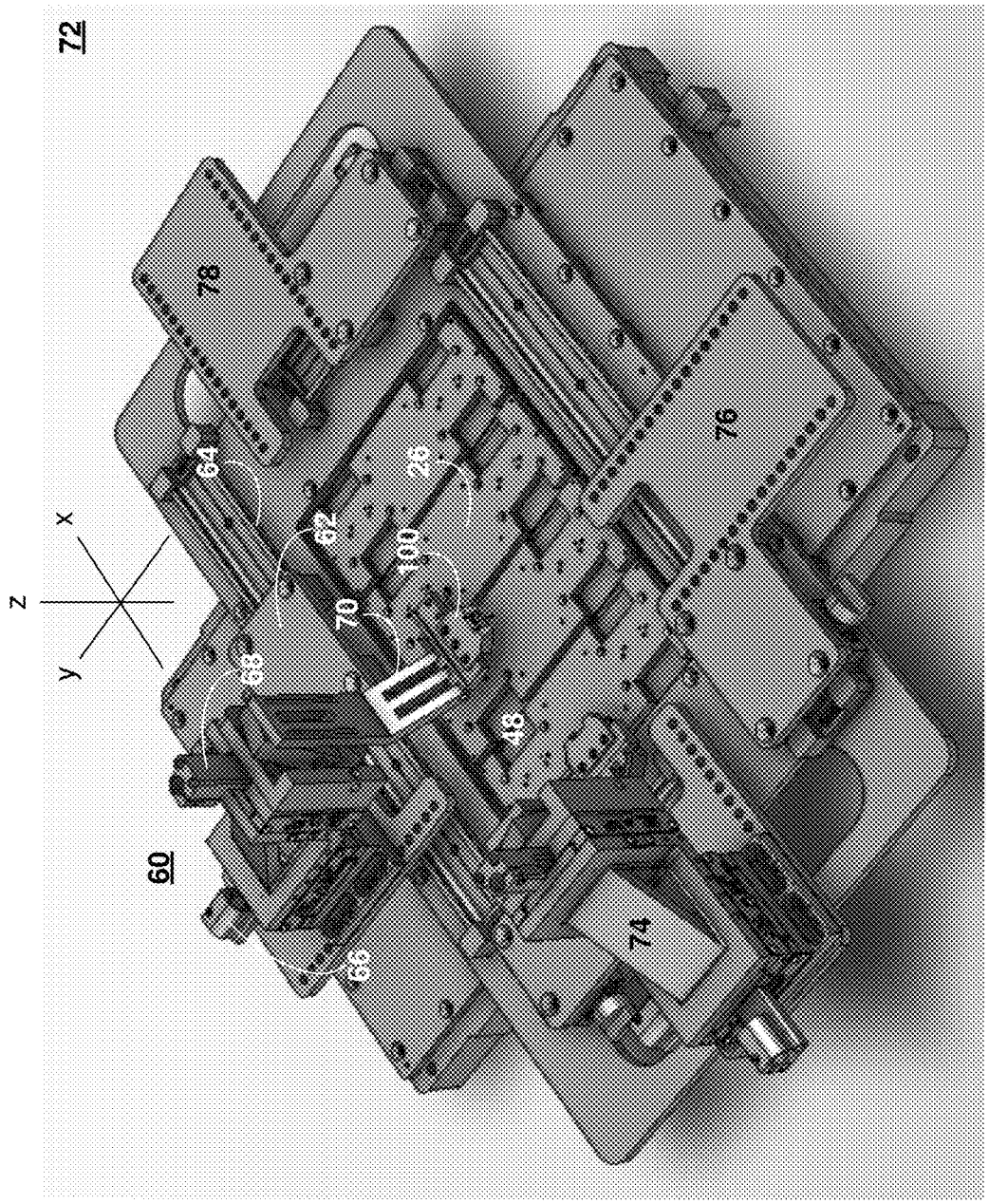
FIG. 1D is a diagrammatic view of a verification platform including a verification probe system.
Figure 2A:
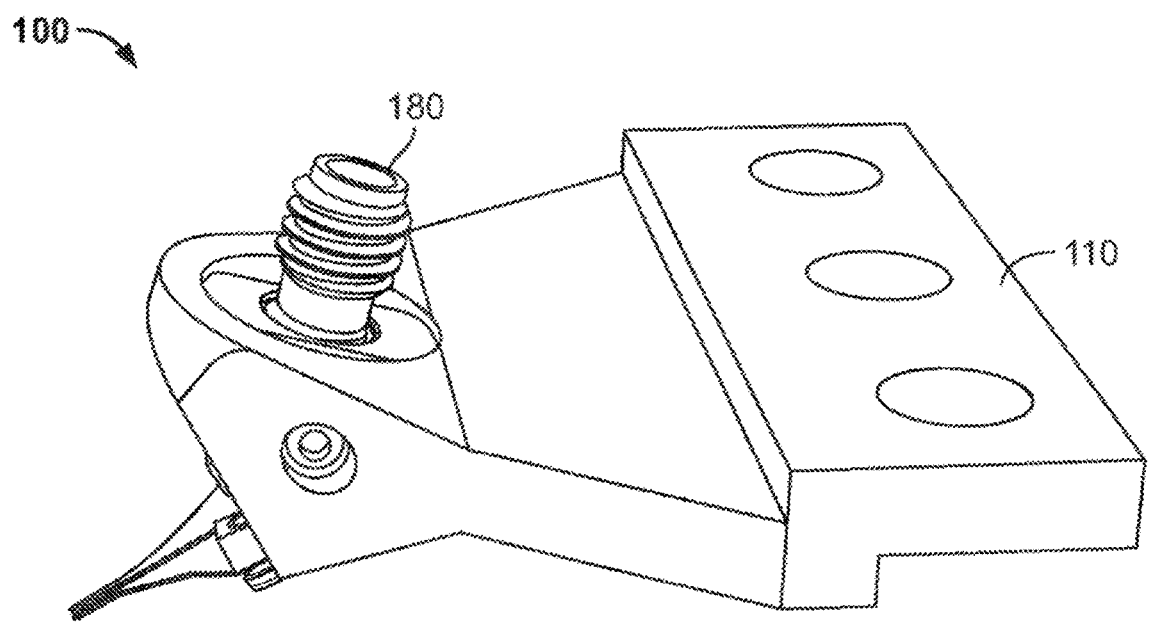
FIGS. 2A-2B are perspective views of a test probe assembly of the verification probe system of FIG. 1D.
Figure 2B:
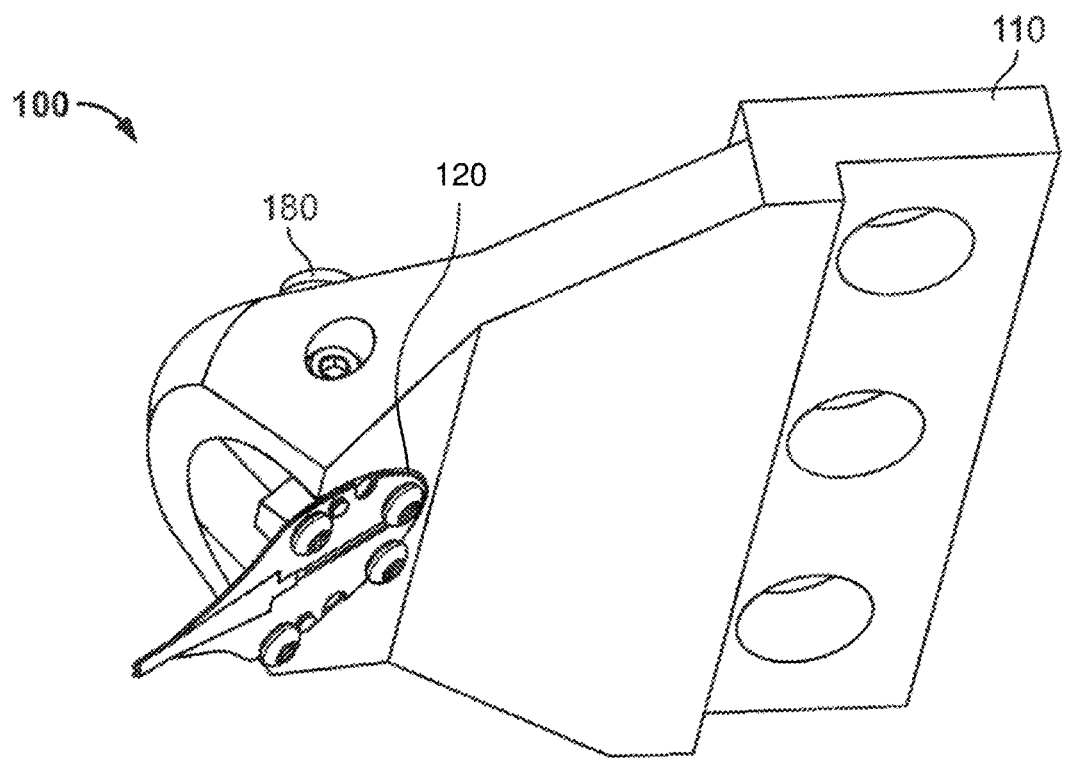
Figure 3:
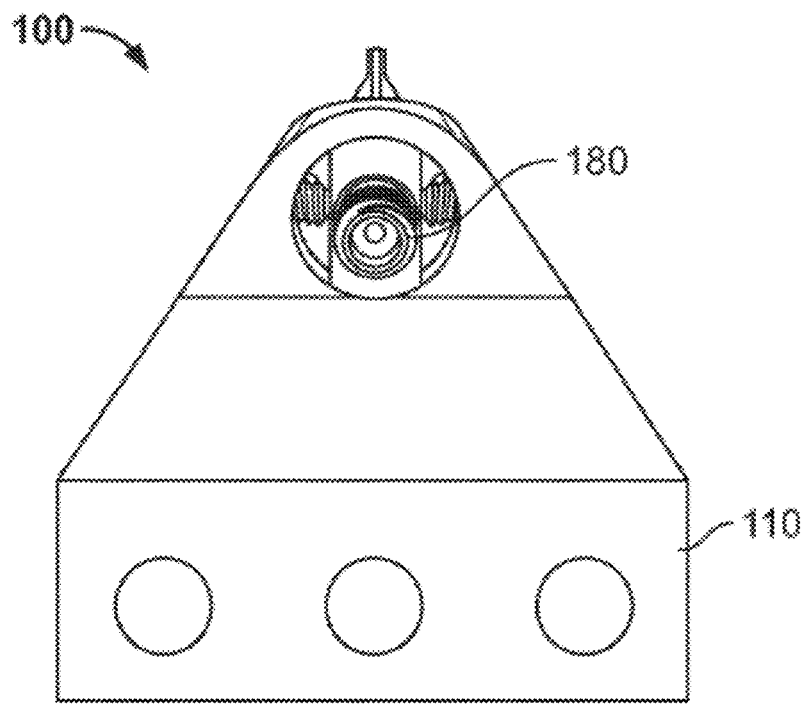
FIGS. 3-6 are various views the test probe assembly of FIGS. 2A-2B.

Referring also to FIG. 1D, there is shown verification probe system 60 that is configured to allow for the specification and verification of automated test platform 10 at test socket assembly 48. As discussed above, adapter board 26 may be configured to enable the testing of a plurality of Devices under Test (e.g., DUTs 28, 30, 32). Accordingly, adapter board 26 may include a plurality of test socket assemblies. For example, FIG. 1D is shown to include eight test socket assemblies (one of which is test socket assembly 48).

In this particular implementation, verification probe system 60 is shown to include moveable platform 62 to which integrated circuit test probe assembly 100 is attached. Moveable platform 62 may be displaceable in the x-axis, y-axis and/or z-axis directions. For example, moveable platform 62 may include first-axis displacement system 64 configured to allow for displacement of integrated circuit test probe assembly 100 in a first axis (e.g., the x-axis). Additionally, moveable platform 62 may include second-axis displacement system 66 configured to allow for displacement of integrated circuit test probe assembly 100 in a second axis (e.g., the y-axis). Further, moveable platform 62 may include third-axis displacement system 68 configured to allow for displacement of integrated circuit test probe assembly 100 in a third axis (e.g., the z-axis). Verification probe system 60 may include bracket assembly 70 for affixing integrated circuit test probe assembly 100 to moveable platform 62.

As discussed above, adapter board 26 may include test socket assembly 48 configured to releasable receive the Device under Test (e.g., DUT 28), wherein test socket assembly 48 may include a plurality of conductive pins (e.g., conductive pins 50) configured to releasably electrically couple the Device under Test (e.g., DUT 28) to adapter board 26 and be compressible in the direction of arrows 52 (i.e., the z-axis).

Accordingly:
First-axis displacement system 64 may be configured to allow for horizontal displacement of integrated circuit test probe assembly 100 within the x-axis so that integrated circuit test probe assembly 100 may be precisely aligned (in the x-axis) with a specific conductive pin chosen from the plurality of conductive pins (e.g., conductive pins 50) to be tested/verified. First-axis displacement system 64 may be a manually-actuated displacement system, an example of which may include but is not limited to a micrometer-based displacement system for use by an administrator (not shown) of verification probe system 60. Additionally/alternatively, first-axis displacement system 64 may be an electronically-actuated displacement system, an example of which may include but is not limited to a stepper-motor-based displacement system controlled by platform process 10 executed on automated test platform 10.

Second-axis displacement system 66 may be configured to allow for horizontal displacement of integrated circuit test probe assembly 100 within the y-axis so that integrated circuit test probe assembly 100 may be precisely aligned (in the y-axis) with a specific conductive pin chosen from the plurality of conductive pins (e.g., conductive pins 50) to be tested/verified. Second-axis displacement system 66 may be a manually-actuated displacement system, an example of which may include but is not limited to a micrometer-based displacement system for use by an administrator (not shown) of verification probe system 60. Additionally/alternatively, second-axis displacement system 66 may be an electronically-actuated displacement system, an example of which may include but is not limited to a stepper-motor-based displacement system controlled by platform process 10 executed on automated test platform 10.

Third-axis displacement system 68 may be configured to allow for vertical displacement of integrated circuit test probe assembly 100 in a third axis (e.g., the z-axis), thus allowing for the precise and controlled compression of a specific conductive pin chosen from the plurality of conductive pins (e.g., conductive pins 50) to be tested/verified. Third-axis displacement system 68 may be a manually-actuated displacement system, an example of which may include but is not limited to a micrometer-based displacement system for use by an administrator (not shown) of verification probe system 60. Additionally/alternatively, third-axis displacement system 68 may be an electronically-actuated displacement system, an example of which may include but is not limited to a stepper-motor-based displacement system controlled by platform process 10 executed on automated test platform 10.

As discussed above, adapter board 26 may include a plurality of test socket assemblies. Accordingly, verification platform 72 may include a plurality of verification probe systems. For example, verification platform 72 is shown to include a first verification probe system (e.g., verification probe system 60 that was discussed above) and a second verification probe system (e.g., verification probe system 74). Additionally and in this example, verification platform 72 is shown to include two additional moveable platforms (e.g., moveable platforms 76, 78) for mounting two additional verification probe systems (not shown).

As will be discussed below in greater detail, integrated circuit test probe assembly 100 may include a co-planar waveguide construction, combined with a mechanically mounted custom radio frequency (RF) connector to provide matched compliant probing mechanism for probing semiconductor devices, PCBs, substrates, bare die, etc. at frequencies up to 110 GHz or even up to 1 THz. The construction and assembly of integrated circuit test probe assembly 100 may allow for simple customization and replacement of individual components, wherein integrated circuit test probe assembly 100 may be more robust than previous probes and may be repaired and configured in the field.

The test probe assembly 100 as shown in general in FIGS. 2A, 2B, 3-6 may include a mounting fixture 110, a co-planar waveguide (CPW) lead frame 120, and an RF connector assembly 180. The co-planar waveguide lead frame 120 may be mounted to the mounting fixture 110. The RF connector assembly may be electrically coupled with the co-planar waveguide lead frame 120.

Referring to FIGS. 9-13, the co-planar waveguide lead frame 120 is shown in greater detail. The co-planar waveguide lead frame 120 may include a metal layer 122 and a substrate layer 124. The metal layer 122 may include a signal lead 142 surrounded on two sides by a ground 140, creating a co-planar waveguide transmission line, and extends to a device contact point 126. The gap 128 and signal width may be defined to match the impedance of the test equipment and the device under test (DUT). In one or more embodiments, the impedance may be 50 ohms. The matched impedances may be customized depending on the application.

Figure 11:
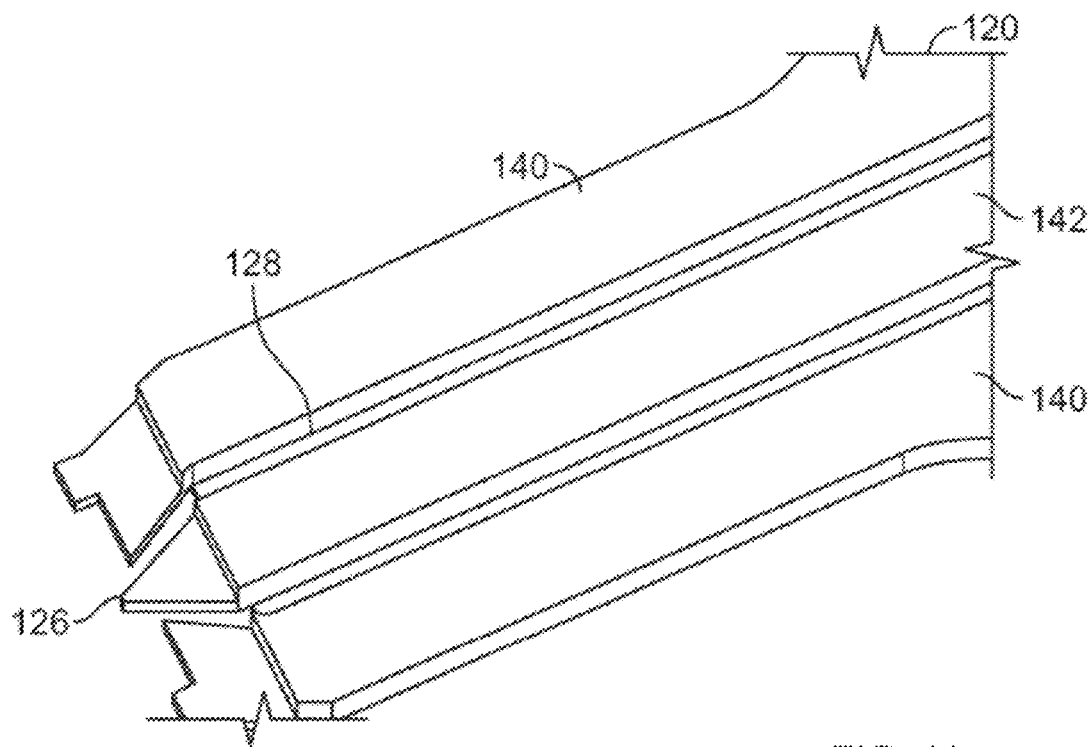
Figure 12:
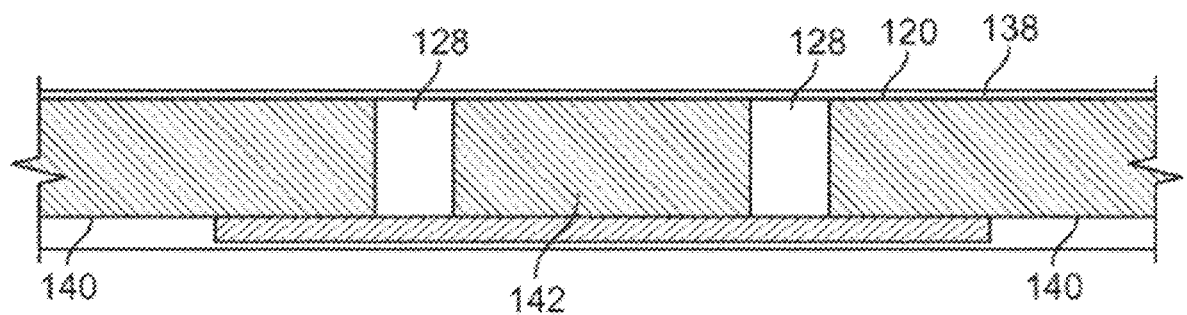
FIG. 12 is a side view of a portion of the lead frame assembly of FIG. 9.
Figure 20:
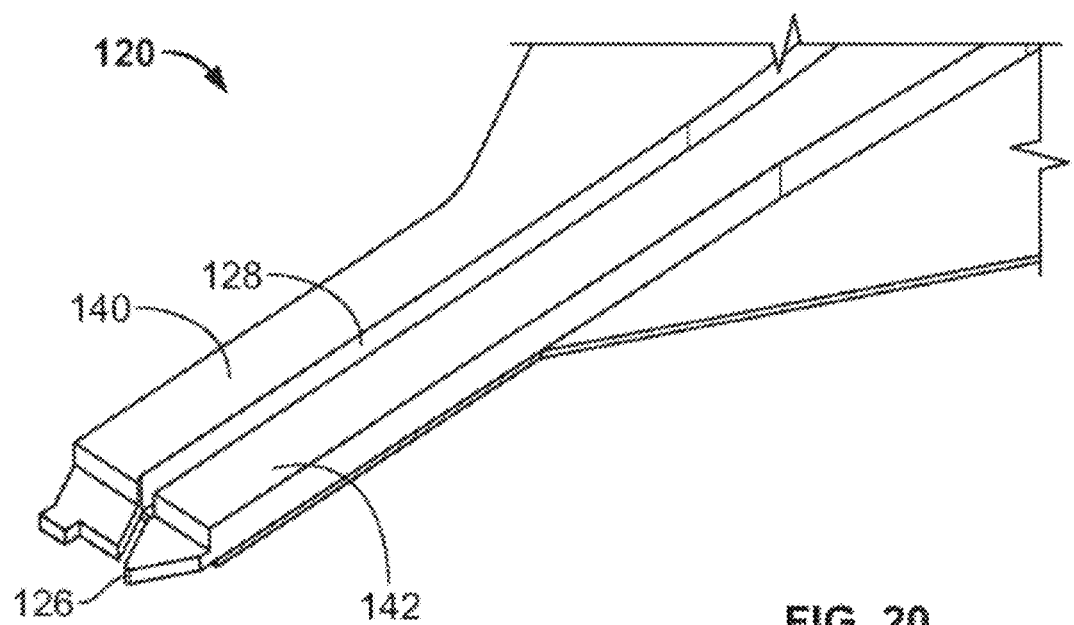
FIG. 20 is an enlarged view of a portion of a lead frame assembly having a GS configuration of the test probe assembly of FIGS. 2A-2B.
Figure 21:
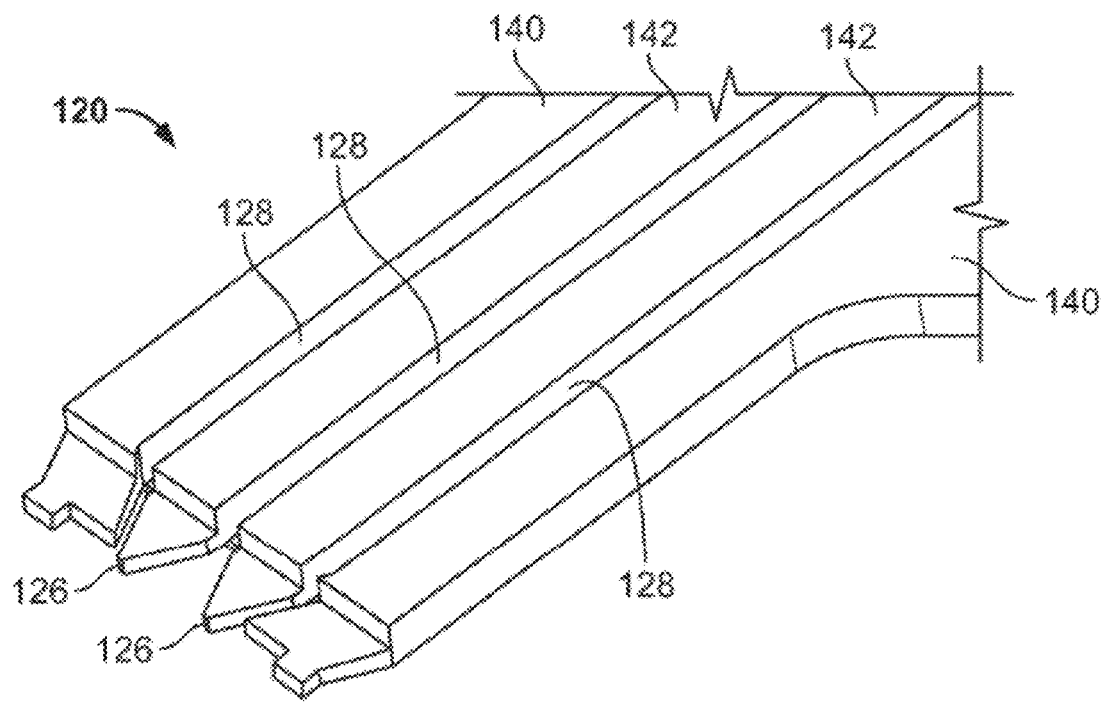
FIG. 21 is an enlarged view of a portion of a lead frame assembly having a GSSG configuration of the test probe assembly of FIGS. 2A-2B.
Figure 24:
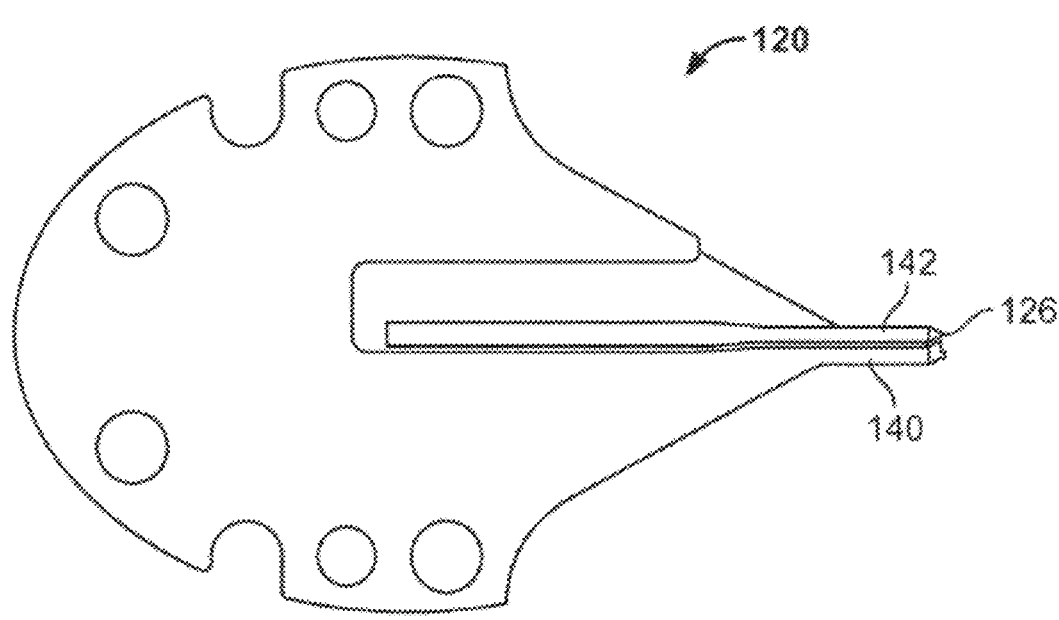
FIG. 24 is a view of a lead frame assembly.

In one or more embodiments, the co-planar waveguide lead frame 120 may include a single ground-signal-ground co-planar waveguide, as shown in FIGS. 11-12. In one or more embodiments, the co-planar waveguide lead frame 120 may support a single ended ground-signal (GS) transmission lines, for instance matched to 50 ohms, as shown in FIGS. 20, 24. In one or more embodiments, the co-planar waveguide lead frame 120 may include a ground-signal-signal-ground (GSSG) transmission lines, which are typically matched to 100 ohm impedance, as shown in FIG. 21. For a GSSG configuration, two RF connector assemblies may be mounted on a single assembly.

Figure 19:
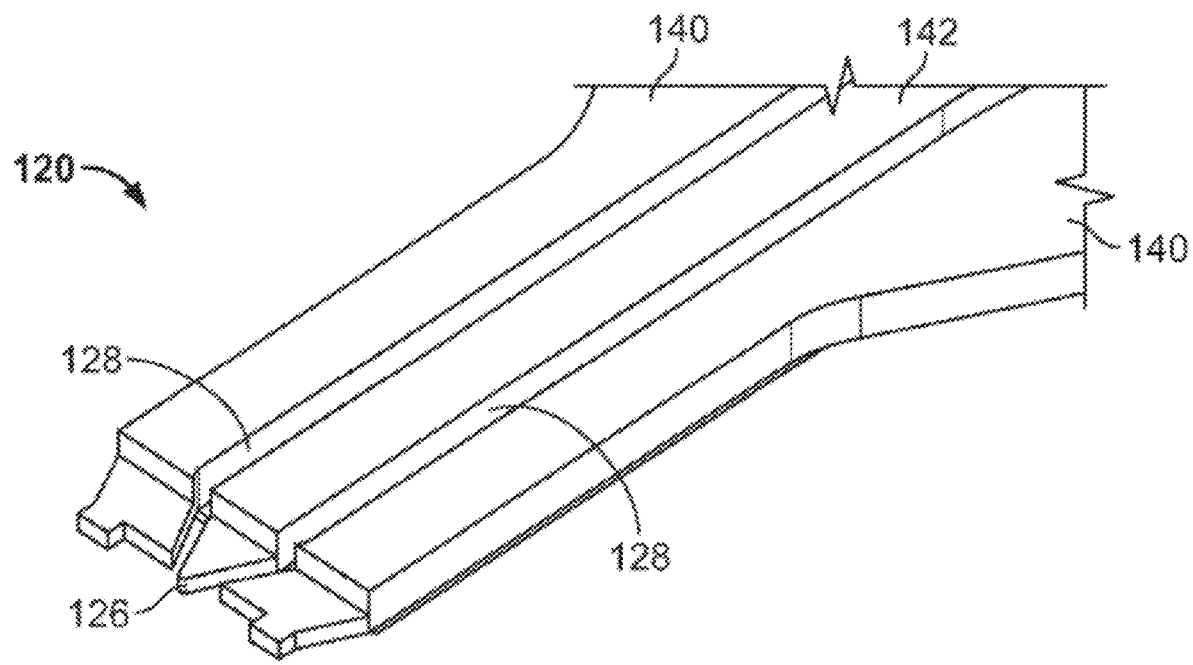
FIG. 19 is an enlarged view of a portion of a lead frame assembly having a GSG configuration of the test probe assembly of FIGS. 2A-2B.
Figure 22:
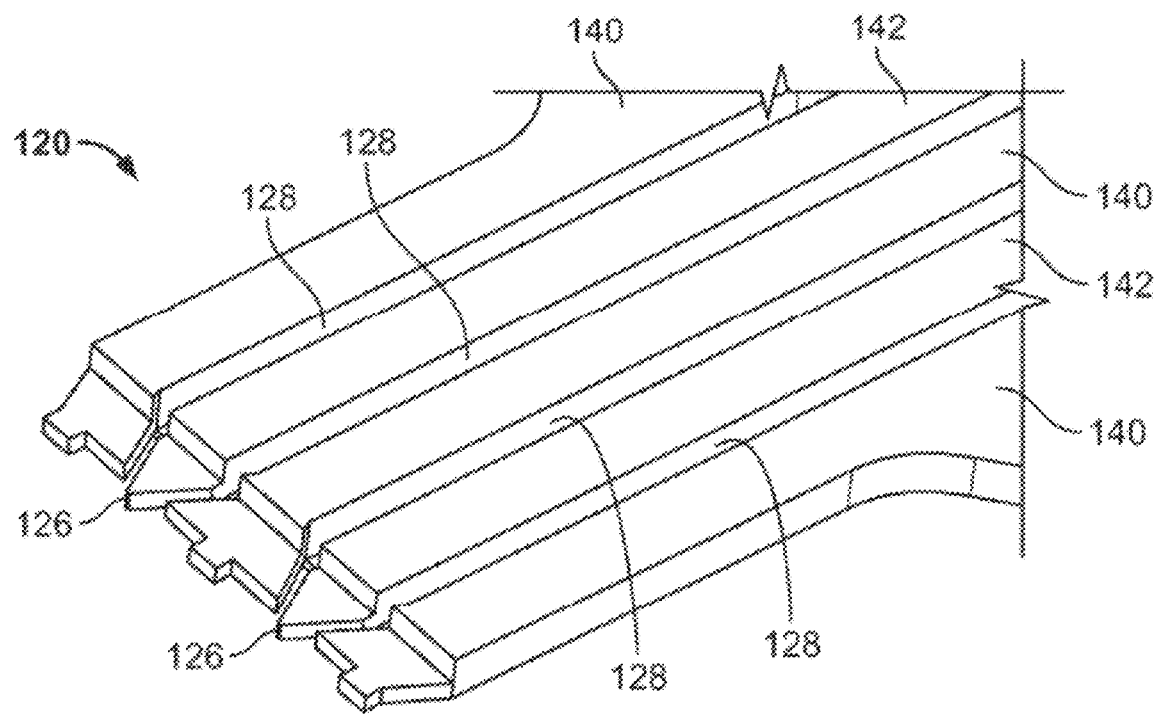
FIG. 22 is an enlarged view of a portion of a lead frame assembly having a GSGSG configuration of the test probe assembly of FIGS. 2A-2B.
Figure 23:
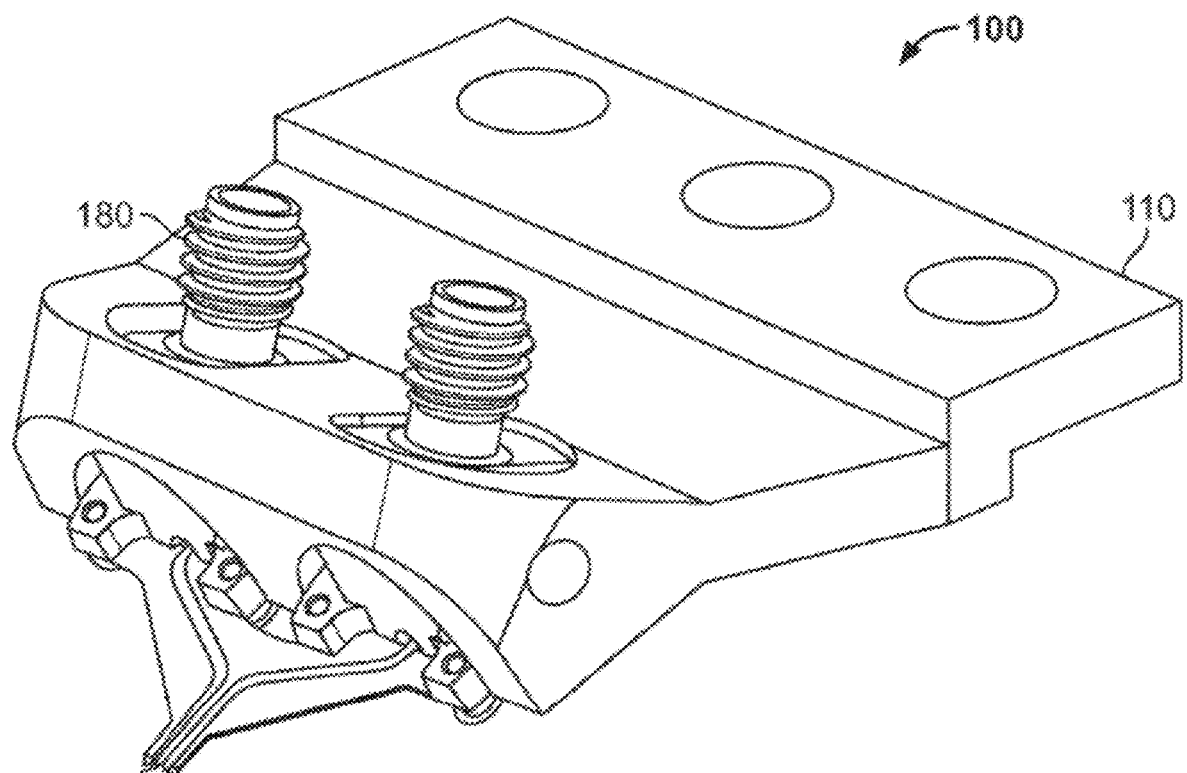
FIG. 23 is a perspective view of a GSGSG test probe assembly.
Figure 25:
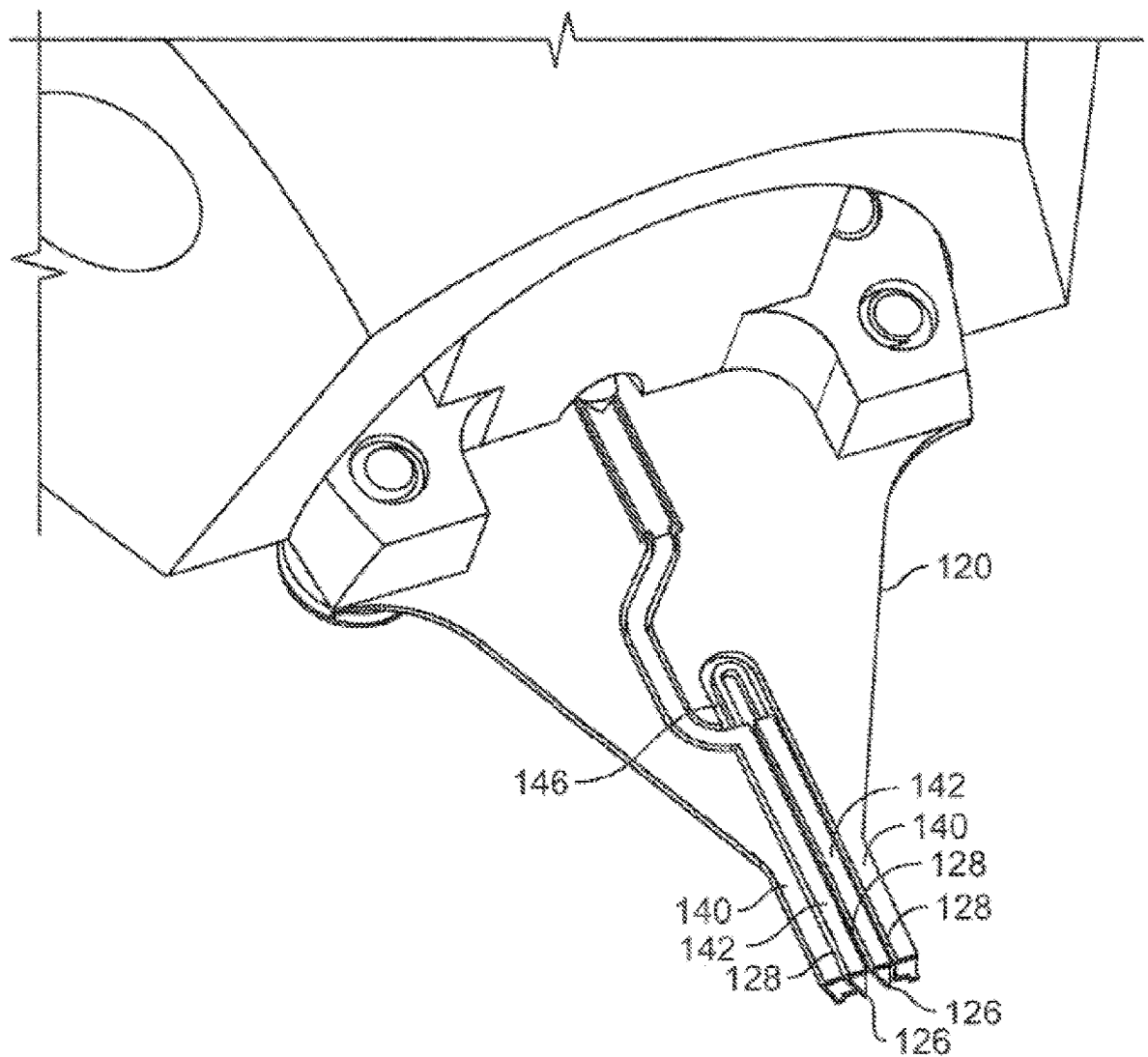
FIG. 25 is a perspective view of a GSGSGSG test probe assembly.

In one or more embodiments, the co-planar waveguide lead frame may be a single ground-signal-ground co-planar (GSG) waveguide lead frame, as shown in FIG. 19. In one or more embodiments, the co-planar waveguide lead frame may be a single ground-signal-signal-ground (GSSG) co-planar waveguide lead frame, as shown in FIG. 21. In one or more embodiments, the co-planar waveguide lead frame may be a single ground-signal-ground-signal-ground (GSGSG) co-planar waveguide lead frame, as shown in FIGS. 22 and 23. For a GSGSG configuration, two RF connector assemblies 180 may be mounted on a single assembly 100, as shown in FIG. 23. In one or more embodiments, the co-planar waveguide lead frame may be a single ground-signal-ground-signal-ground-signal-ground (GSGSGSG) co-planar waveguide lead frame, as shown in FIG. 25. In one or more embodiments, the co-planar waveguide lead frame may include a single-ended to differential balun 146, which may be used to shift phase, as shown in FIG. 25. In one or more embodiments, the co-planar waveguide lead frame may be multiple ground-signal-ground co-planar waveguide lead frame. The co-planar waveguide lead frame 120 may be customized for any ground/signal pitch 144.

Figure 9:
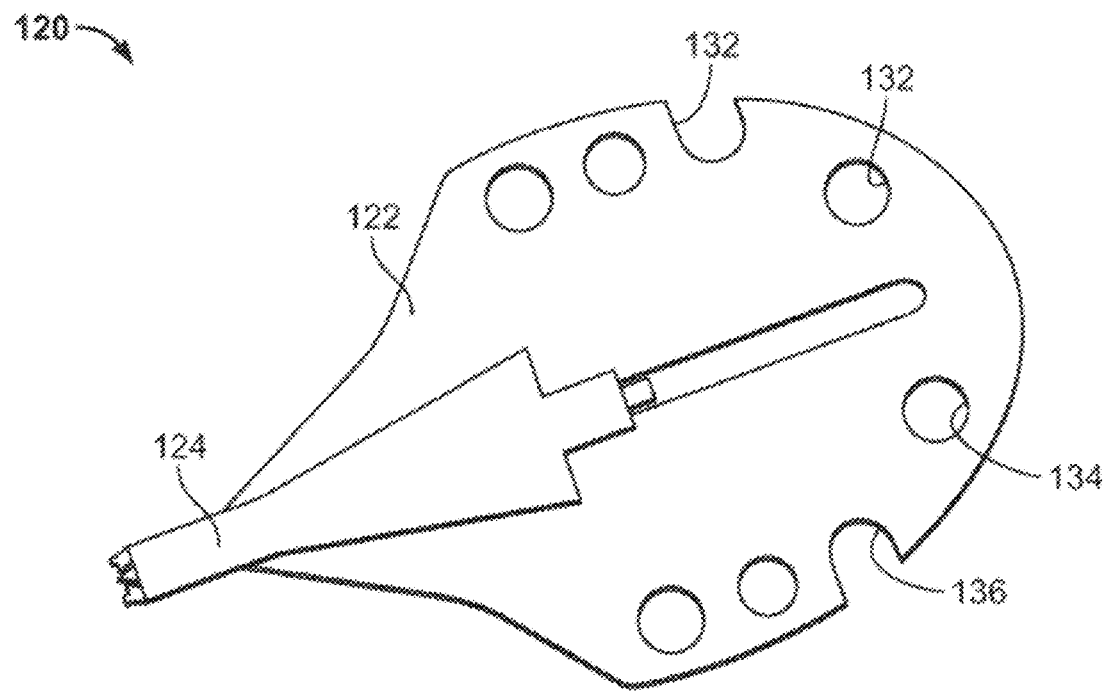
FIG. 9 is a top view of a lead frame assembly of the test probe assembly of FIGS. 2A-2B.
Figure 10:
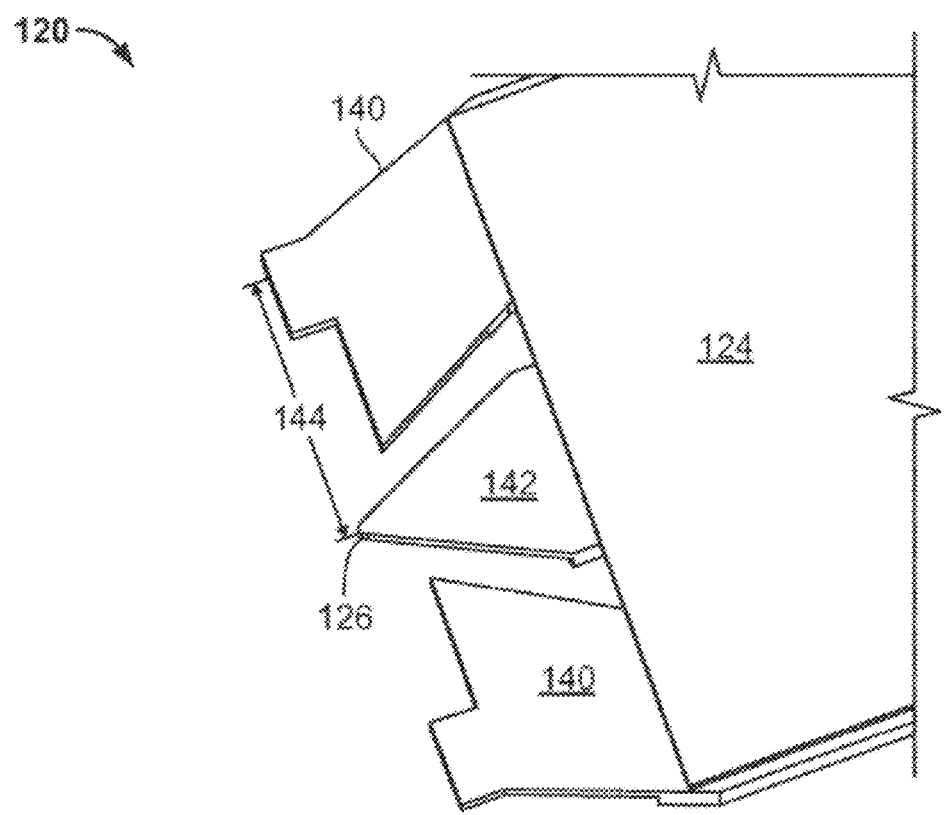
FIGS. 10-11 are enlarged views of a portion of the lead frame assembly of FIG. 9.
Figure 13:
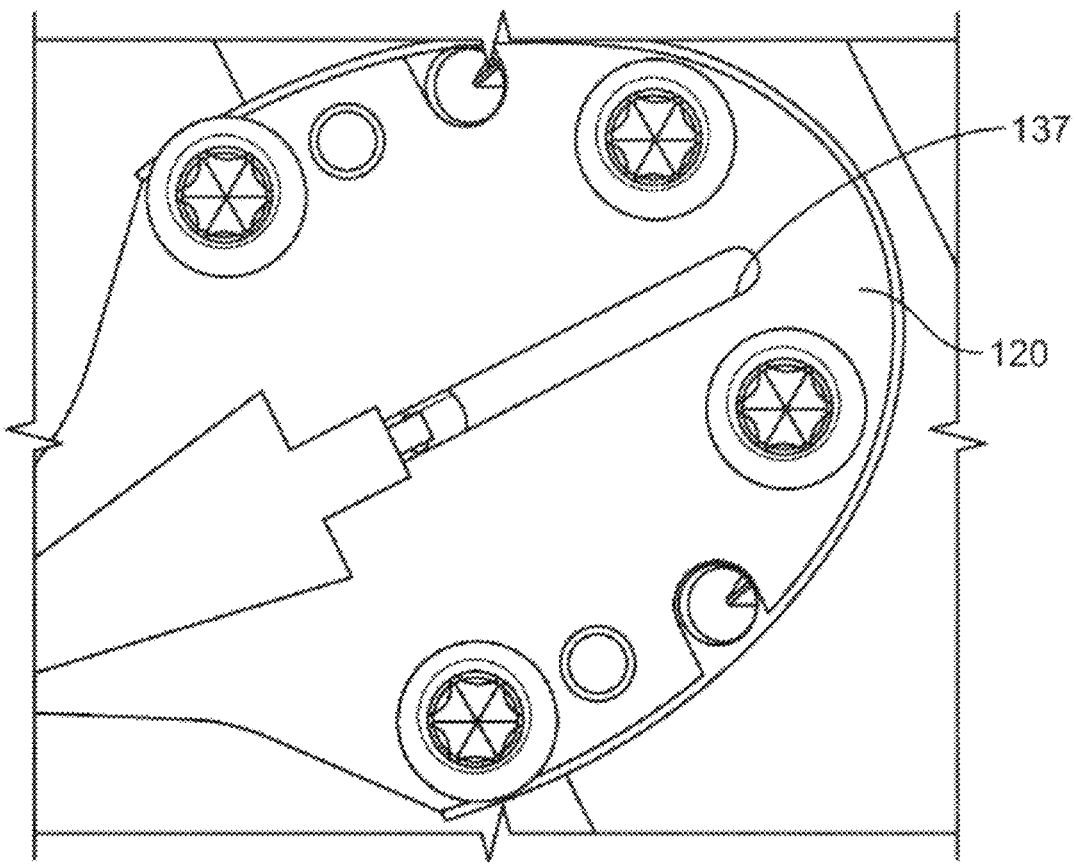
FIG. 13 is an enlarged, bottom perspective view of a portion of the test probe assembly of FIGS. 2A-2B.

The co-planar waveguide lead frame 120 may be defined in part by a plane 138, as shown in FIG. 12, and further includes mounting structure 132, as shown in FIG. 9. In one or more embodiments, the mounting structure 132 may include screw holes 134. In one or more embodiments, the mounting structure 132 may include dowel pin slots 136. The mounting structure 132 may be used to receive structure therein to secure the co-planar waveguide lead frame 120 to the mounting fixture 110. The mounting structure 132 may allow for the co-planar waveguide lead frame 120 to be interchanged for different DUT requirements, and may allow for the co-planar waveguide lead frame 120 to be replaceable. The co-planar waveguide lead frame 120 may further include a conductor slot 137, as shown in FIG. 13.

The RF connector assembly may allow connection from the co-planar waveguide lead frame 120 to the test equipment through, for example, 1 mm, 1.85 mm, 2.92 mm, and SMA standard connector interfaces. The RF connector assembly may include a threaded portion that may be replaceable for any cable standard available. The RF connector assembly 180 may provide the shortest path from the cable to the co-planar waveguide lead frame 120 and may be fully impedance controlled from the cable connection to the interface of the co-planar waveguide lead frame 120.

Figure 4:
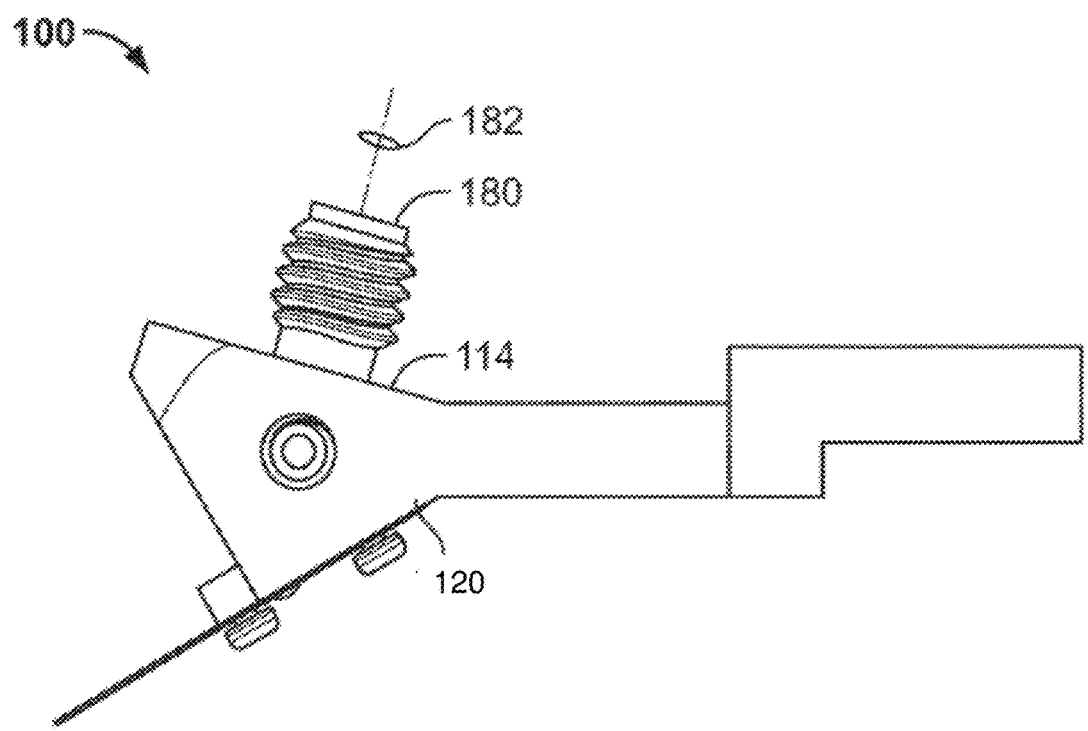
Figure 5:
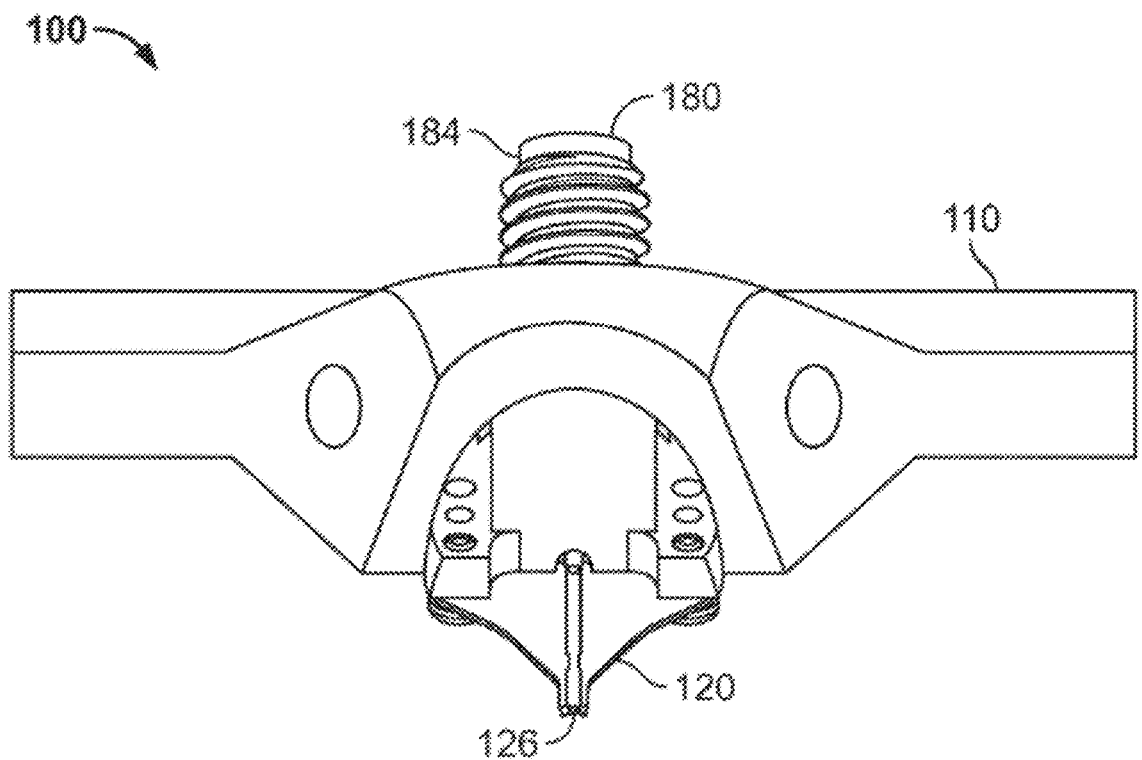
Figure 6:
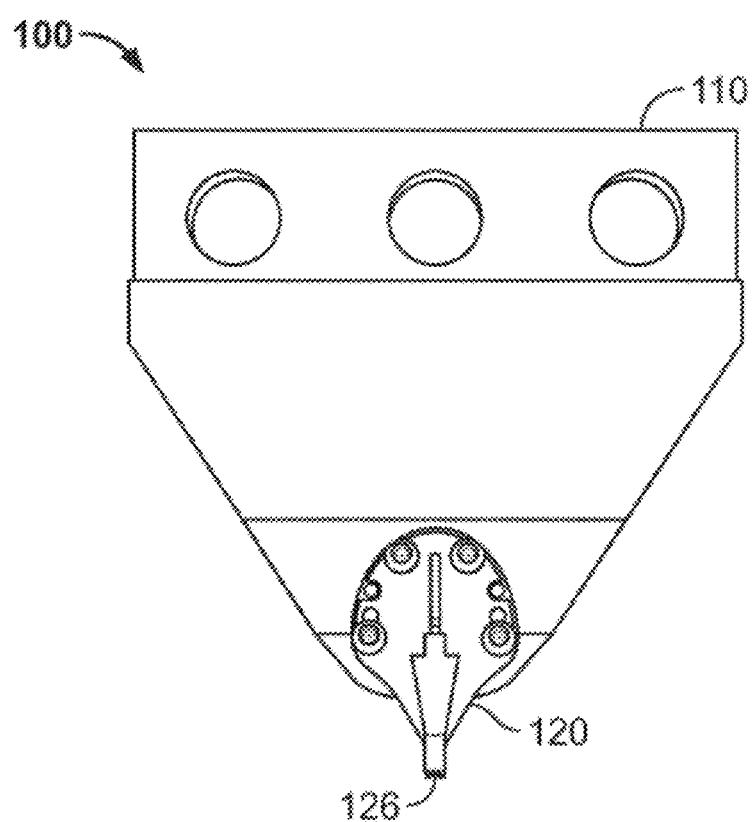
Figure 7:
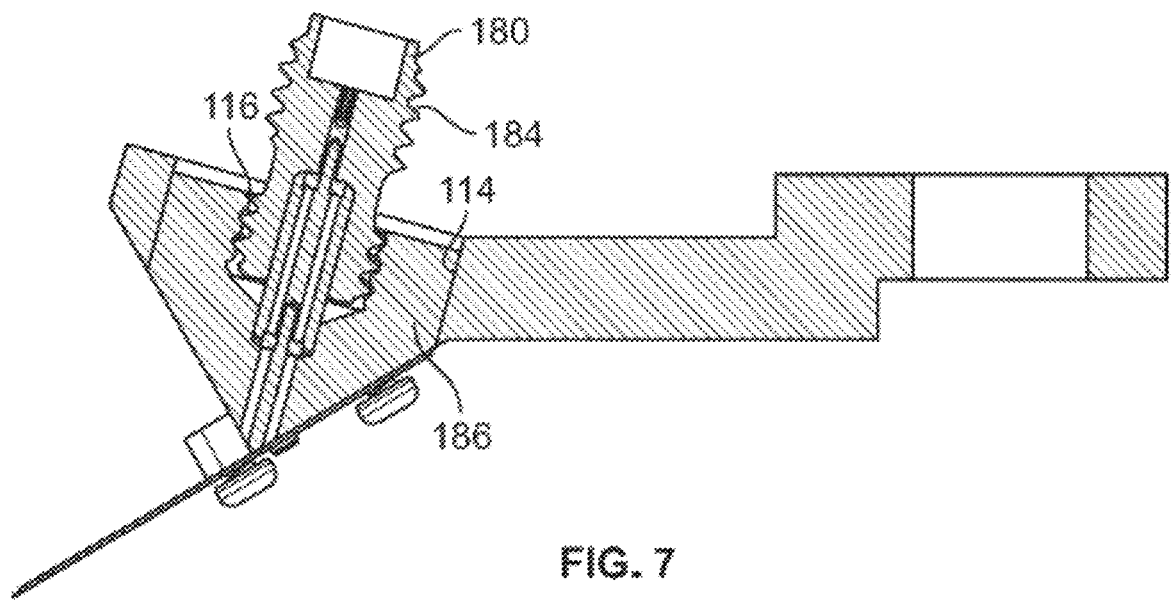
FIG. 7 is a side cross-sectional view of the test probe assembly of FIGS. 2A-2B.
Figure 8:
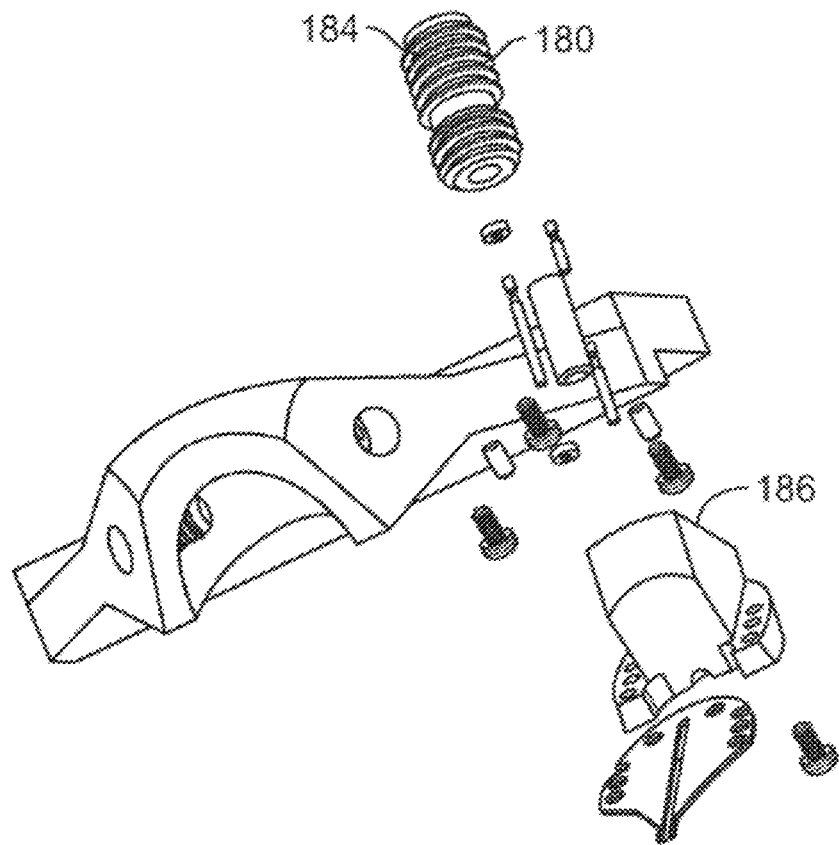
FIG. 8 is an exploded perspective view of the test probe assembly of FIGS. 2A-2B.
Figure 14:
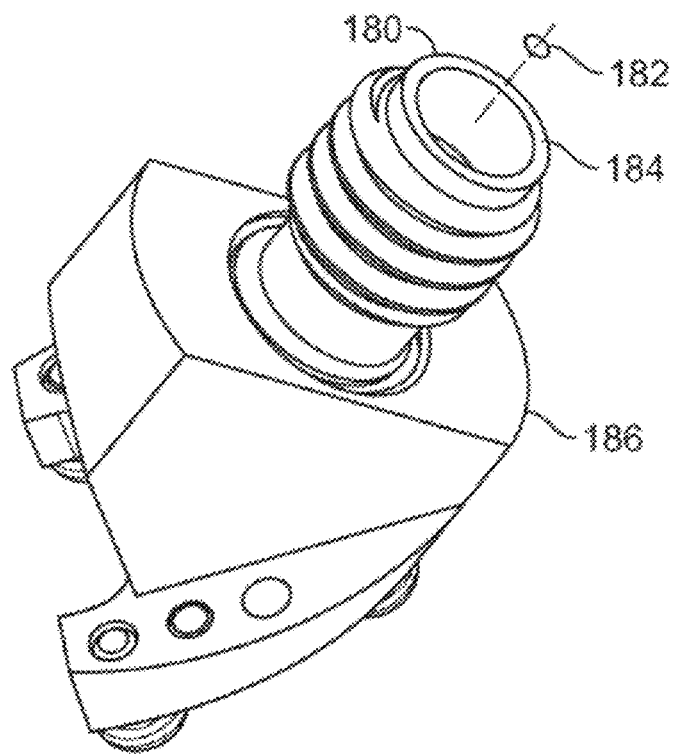
FIG. 14 is a perspective view of the test probe assembly of FIGS. 2A-2B.

The RF connector assembly 180 may be defined in part by a longitudinal axis 182 as shown in FIGS. 4 and 14. The RF connector assembly includes a connector 184, and a connector body 186. The connector body 186 may include a threaded opening 116 that receives the threaded connector 184 therein. In one or more embodiments, the RF connector assembly 180 may be angled relative to the co-planar waveguide lead frame 120 such that the connector longitudinal axis 182 may be disposed at a 45 degree angle relative to the plane 138 of the co-planar waveguide lead frame 120. The 45 degree angle may provide a matched impedance launch from the RF connector assembly 180 to the co-planar waveguide lead frame 120.

The barrel of the RF connector assembly 180 may be formed, for example, from common rod stock. The physical connection from the connector to the co-planar waveguide lead frame 120 may be accomplished using cap screws located on the bottom of the RF connector assembly. The screw holes in the body may be be tapped to allow mounting of the co-planar waveguide lead frame 120 directly to the RF connector assembly or they may be through holes to allow the connector to sandwich the co-planar waveguide lead frame 120 between the RF connector assembly 180 and another body of material under the co-planar waveguide lead frame 120.

Figure 18:
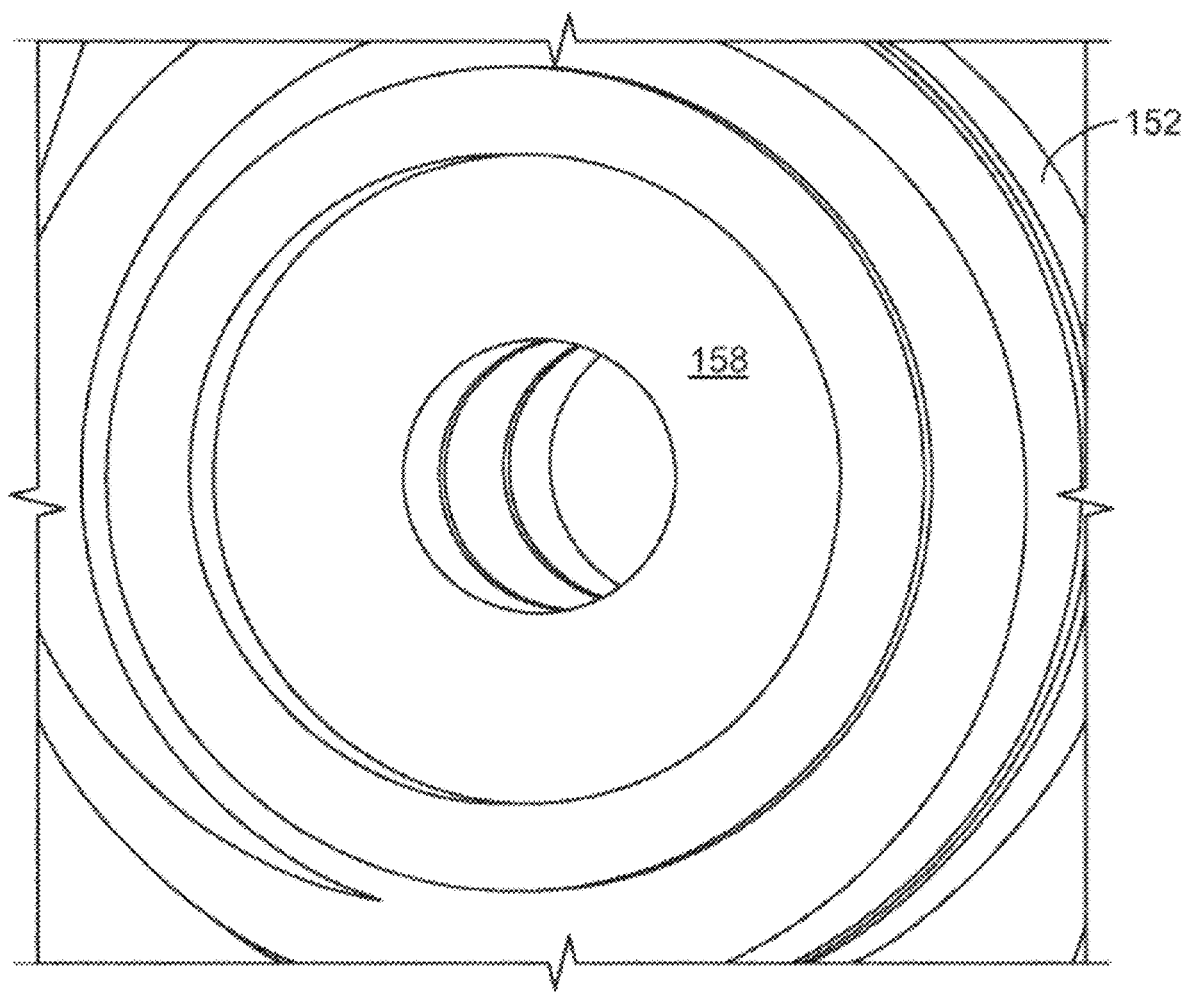
FIG. 18 is a perspective view of a portion of the center conductor assembly of FIG. 16.

In one or more embodiment, the RF connector assembly 180 may include a center conductor assembly 150. The at least one RF connector assembly 180 may include a center conductor assembly 150 which may include a center conductor 154 and a housing 152. The center conductor 154 may extend from a first end 156 to a second end 158 and may be defined in part by a conductor longitudinal axis 160. In one or more embodiments, the center conductor 154 may include a tapered end 162 at the second end 158. In one or more embodiments, the center conductor 154 may include one or more recessed portions 156. In one or more embodiments, the test probe assembly may further include one or more spacers 158 disposed within the one or more recessed portions 156. In one or more embodiments, the one or more spacers 158 may be cross-linked polystyrene microwave plastic spacers. In one or more embodiments, the one or more spacers 158 may have a disc shape. The spacers 158 may be disposed between the housing 152 and the center conductor 154 (See FIG. 18). The housing 152 may hold the co-planar waveguide lead frame 120 and RF connector assembly 180 in a test position for attachment to a probing station or similar manipulator equipment. The housing 152 may be customized in length and width. The angled side may allow multiple housing assemblies set adjacent to each other to provide closely spaced contacts on the DUT to be probed.

Figure 15:
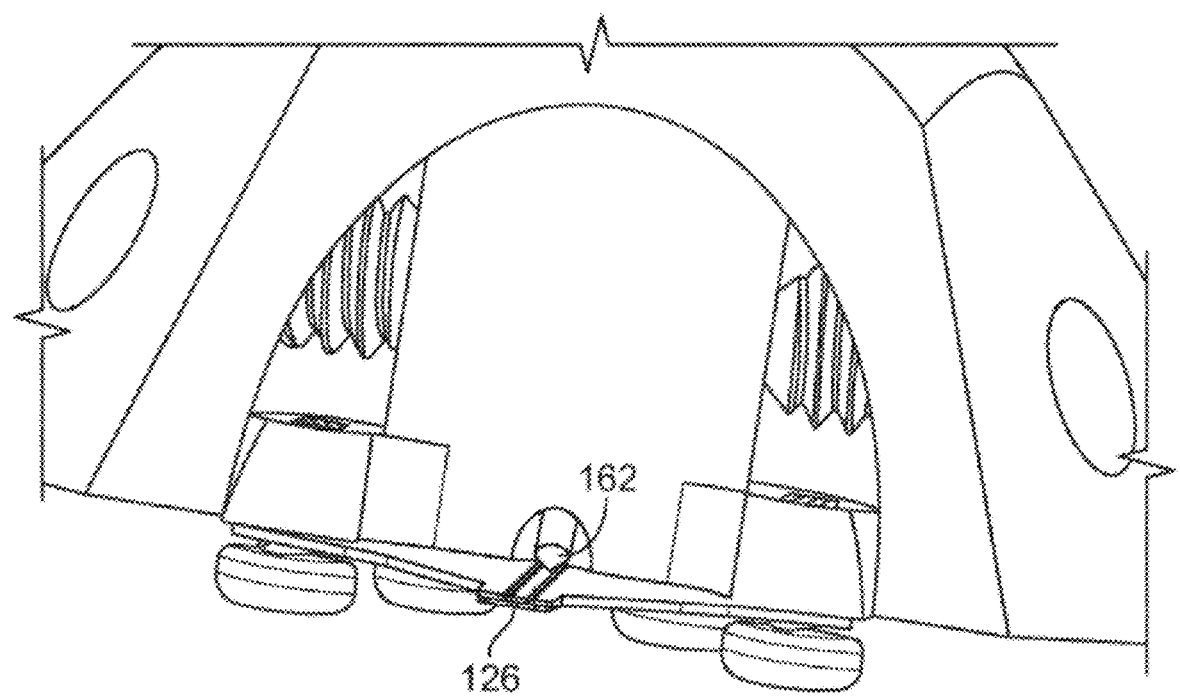
FIG. 15 is an enlarged perspective view of a portion of the test probe assembly of FIGS. 2A-2B.
Figure 16:
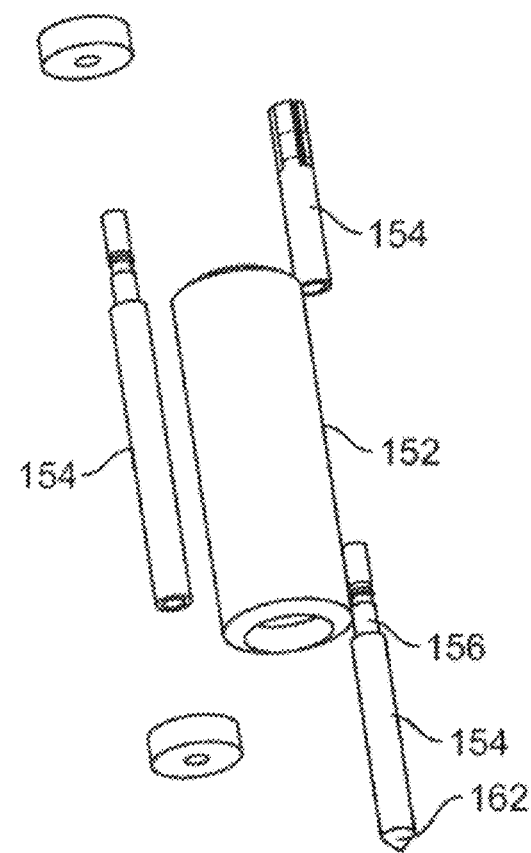
FIG. 16 is an exploded perspective view of a center conductor assembly of the test probe assembly of FIGS. 2A-2B.
Figure 17:
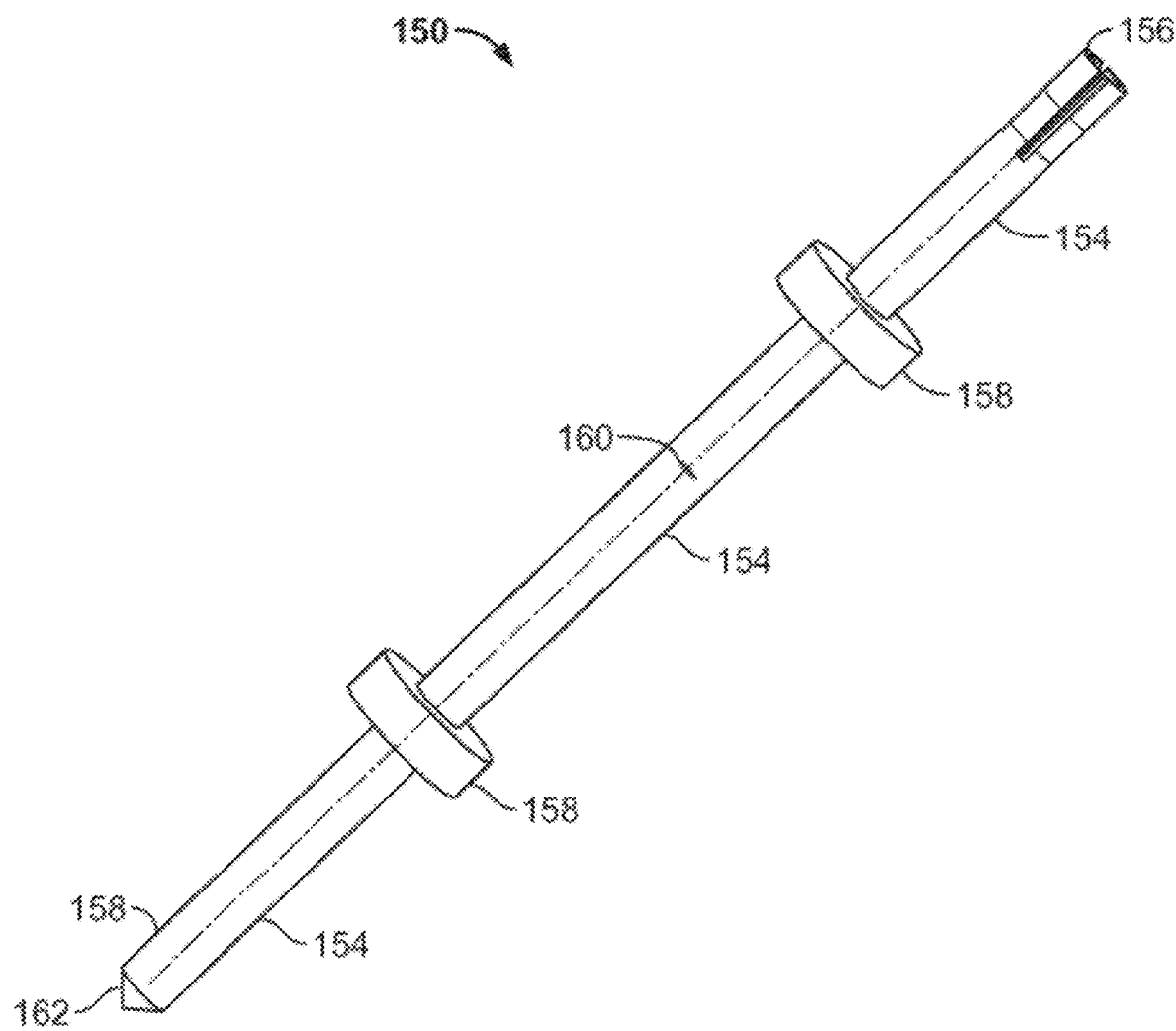
FIG. 17 is a perspective view of the center conductor assembly of FIG. 16.

The center conductor 154 of the center conductor assembly 150 may maximize the impedance match at the interface between the center conductor 154 and the co-planar waveguide lead frame 120. The center conductor 154 may be tapered and compression mounted, in one embodiment, to the co-planar waveguide lead frame 120 such that it ensures a reliable connection and provides optimal impedance match between connector and lead frame. The taper may be angled to maximize the surface area of contact to the co-planar waveguide lead frame 120, as shown in FIG. 15. In one or more embodiments, the center conductor assembly 150 may include small spacers that may be captivated on the center conductor 154. In one or more embodiments, the center conductor 154 may be formed of two or more, or three separate pieces that are press fit together forming recessed portions 156. The spaces may minimize the insertion loss of the conductor while maintaining temperature capability to a desired temperature, for example 150 deg. C.

The test probe assembly may include a co-planar waveguide construction, combined with a mechanically mounted custom radio frequency (RF) connector to provide matched compliant probing mechanism for probing semiconductor devices, PCBs, substrates, bare die, etc. at frequencies up to 110 GHz or even up to 1 THz. The probe tip may be independently compliant and may bend to be used on non-planar surfaces. The construction and assembly may allow for simple customization and replacement of individual components. The probe assembly may be more robust than previous probes, and may be repaired and configured in the field. The lead frame may be customized for any ground/signal pitch required for testing (typical pitches range from 50 to 1250 μm). The lead frame may be replaceable and may be interchanged for different DUT requirements.

General

As will be appreciated by one skilled in the art, the present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet (e.g., network 14).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A verification probe system configured to verify an automated test platform comprising:
    an adapter board including a test socket assembly configured to receive a device under test (DUT), wherein the test socket assembly include a plurality of conductive pins configured to releasably couple the DUT to the adapter board;
    an integrated circuit test probe assembly; and
    a moveable platform configured to position the integrated circuit test probe assembly proximate to one or more conductive pins of the plurality of conductive pins included within the test socket assembly of the automated test platform and configured to precisely align the integrated circuit test probe assembly with a specific conductive pin of the one or more conductive pins included within the test socket assembly, and provide precise and controlled compression of the specific conductive pin of the one or more conductive pins included within the test socket assembly.

2. The verification probe system of claim 1 wherein the moveable platform includes:
    a first-axis displacement system configured to allow for displacement of the integrated circuit test probe assembly in a first axis.

3. The verification probe system of claim 1 wherein the moveable platform includes:
    a second-axis displacement system configured to allow for displacement of the integrated circuit test probe assembly in a second axis.

4. The verification probe system of claim 1 wherein the moveable platform includes:
    a third-axis displacement system configured to allow for displacement of the integrated circuit test probe assembly in a third axis.

5. The verification probe system of claim 1 further comprising:
    a bracket assembly for affixing the integrated circuit test probe assembly to the moveable platform.

6. The verification probe system of claim 1 wherein the integrated circuit test probe assembly includes:
    a mounting fixture;
    at least one co-planar waveguide lead frame having a device contact point, the at least one co-planar waveguide lead frame mounted to the mounting fixture; and
    at least one radio frequency (RF) connector assembly electrically coupled with the at least one co-planar waveguide lead frame.

7. The verification probe system of claim 6, wherein the at least one co-planar waveguide lead frame has a metal layer and a substrate layer.

8. The verification probe system of claim 7, wherein the metal layer has a signal lead surrounded on two sides by a ground.

9. The verification probe system of claim 6, wherein a gap and signal width are defined to match an impedance of test equipment.

10. The verification probe system of claim 9, wherein the gap and the signal width are defined to match an impedance of the DUT.

11. The verification probe system of claim 6, wherein the at least one co-planar waveguide lead frame is a single ground-signal-ground co-planar waveguide lead frame.

12. The verification probe system of claim 6, wherein the at least one co-planar waveguide lead frame is at least one of:
   a single ground-signal-signal-ground co-planar waveguide lead frame,
   a single ground-signal-ground-signal-ground co-planar waveguide lead frame, or
   a single ground-signal-ground-signal-ground-signal-ground co-planar waveguide lead frame.

13. The verification probe system of claim 6, wherein the at least one co-planar waveguide lead frame is a single ended to differential balun.

14. The verification probe system of claim 6, wherein the at least one co-planar waveguide lead frame has a mounting structure.

15. The verification probe system of claim 14, wherein the mounting structure includes one or more of screw holes and dowel pin slots.

16. The verification probe system of claim 6, wherein the at least one RF connector assembly is defined by a longitudinal axis, the longitudinal axis disposed at about a 45 degree angle relative to a plane defining in part the at least one co-planar waveguide lead frame.

17. The verification probe system of claim 6, wherein the at least one RF connector assembly has a center conductor assembly compression mounted to the at least one co-planar waveguide lead frame.

18. The verification probe system of claim 6, wherein the at least one RF connector assembly has a center conductor assembly having at least one center conductor, the at least one center conductor including one or more spacers.

19. A verification probe system configured to verify an automated test platform comprising:
   an adapter board including a test socket assembly configured to receive a device under test (DUT), wherein the test socket assembly include a plurality of conductive pins configured to releasably couple the DUT to the adapter board;
   an integrated circuit test probe assembly; and
   a moveable platform configured to position the integrated circuit test probe assembly proximate to one or more conductive pins of the plurality of conductive pins included within the test socket assembly of the automated test platform and configured to precisely align the integrated circuit test probe assembly with a specific conductive pin of the one or more conductive pins included within the test socket assembly, and provide precise and controlled compression of the specific conductive pin of the one or more conductive pins included within the test socket assembly, wherein the moveable platform includes:
   a first-axis displacement system configured to allow for displacement of the integrated circuit test probe assembly in a first axis,
   a second-axis displacement system configured to allow for displacement of the integrated circuit test probe assembly in a second axis, and
   a third-axis displacement system configured to allow for displacement of the integrated circuit test probe assembly in a third axis.

20. The verification probe system of claim 19 wherein the integrated circuit test probe assembly includes:
   a mounting fixture;
   a co-planar waveguide lead frame having a device contact point, the co-planar waveguide lead frame mounted to the mounting fixture; and
   at least one radio frequency (RF) connector assembly electrically coupled with the co-planar waveguide lead frame, the at least one RF connector assembly includes a connector body and a center conductor assembly, the center conductor assembly including a center conductor extending from a first end to a second end and is defined in part by a conductor longitudinal axis.

21. The verification probe system of claim 20, wherein the center conductor includes a tapered end at the first end.

22. The verification probe system of claim 20, wherein the center conductor includes one or more recessed portions.

23. The verification probe system of claim 22, further comprising one or more spacers disposed within the one or more recessed portions.

24. The verification probe system of claim 23, wherein the one or more spacers have a disc shape.

25. The verification probe system of claim 20, wherein the at least one RF connector assembly is defined by a longitudinal axis, the longitudinal axis disposed at about a 45 degree angle relative to a plane defining in part the co-planar waveguide lead frame.

26. The verification probe system of claim 20, wherein a gap and signal width are defined to match an impedance of test equipment.

27. The verification probe system of claim 26, wherein the gap and the signal width are defined to match an impedance of the DUT.

* * * * *